(12) United States Patent
Uemura et al.

(10) Patent No.: US 8,561,006 B2
(45) Date of Patent: Oct. 15, 2013

(54) SIGNAL TRANSMISSION CIRCUIT FOR INCREASING SOFT ERROR TOLERANCE

(75) Inventors: Taiki Uemura, Kawasaki (JP);
Yoshiharu Tosaka, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 915 days.

(21) Appl. No.: 12/053,886

(22) Filed: Mar. 24, 2008

(65) Prior Publication Data

US 2008/0191769 A1  Aug. 14, 2008

Related U.S. Application Data

(63) Continuation of application No. PCT/JP2005/017445, filed on Sep. 22, 2005.

(51) Int. Cl.
*G06F 17/50* (2006.01)

(52) U.S. Cl.
USPC ............ 716/134; 716/132; 716/136; 714/704

(58) Field of Classification Search
USPC ......... 716/1, 2, 4, 6, 108, 111, 113, 132, 134, 716/136; 714/704
See application file for complete search history.

(56) References Cited

U.S. PATENT DOCUMENTS

| | | | |
|---|---|---|---|
| 5,065,048 A * | 11/1991 | Asai et al. | 326/34 |
| 5,311,070 A * | 5/1994 | Dooley | 327/208 |
| 6,023,568 A * | 2/2000 | Segal | 716/6 |
| 6,208,188 B1 | 3/2001 | Shionoya | |
| 6,326,809 B1 * | 12/2001 | Gambles et al. | 326/46 |
| 6,377,097 B1 * | 4/2002 | Shuler, Jr. | 327/208 |
| 7,474,116 B2 * | 1/2009 | Uemura et al. | 326/9 |
| 7,619,455 B2 * | 11/2009 | Carlson et al. | 327/212 |

(Continued)

FOREIGN PATENT DOCUMENTS

| | | |
|---|---|---|
| EP | 0 827 097 A2 | 3/1998 |
| JP | 10-63703 A | 3/1998 |
| JP | 11-340957 A | 12/1999 |
| JP | 2000-195274 A | 7/2000 |

OTHER PUBLICATIONS

T. Uemura et al. "Neutron-induced soft-Error Simulation Technology for Logic Circuits"; Extended Abstracts of the 2005 International Conference on Solid State Devices and Materials, JSAP, Sep. 15, 2005, pp. 942 to 943.

(Continued)

*Primary Examiner* — Naum Levin
(74) *Attorney, Agent, or Firm* — Westerman, Hattori, Daniels & Adrian, LLP

(57) ABSTRACT

A CAD device according to the embodiments includes means that determines signal transmission time of each signal transmission circuit in an LSI circuit, means that determines an output inversion rate of a flip-flop circuit included in each signal transmission circuit when the flip-flop circuit is exposed to radiation, means that determines a signal transmission circuit that is a critical path, means that calculates a total soft error rate of the LSI circuit on the basis of the signal transmission time, the output inversion rate, and a clock period, and means that, when a predetermined soft error rate is less than the total soft error rate of the LSI circuit as a result of comparison, reducing the total soft error rate of the LSI circuit to the extent possible without changing signal transmission time of the signal transmission circuit, which is a critical path.

8 Claims, 12 Drawing Sheets

(56) References Cited

U.S. PATENT DOCUMENTS

| | | | |
|---|---|---|---|
| 2001/0028269 A1* | 10/2001 | Shuler, Jr. | 327/277 |
| 2004/0199888 A1* | 10/2004 | Katla et al. | 716/6 |
| 2005/0127971 A1* | 6/2005 | Hoff | 327/217 |
| 2007/0226572 A1* | 9/2007 | Zhang et al. | 714/742 |
| 2007/0262787 A1* | 11/2007 | Chakraborty et al. | 326/16 |
| 2010/0213998 A1* | 8/2010 | Uemura et al. | 327/203 |

OTHER PUBLICATIONS

Taiki Uemura et al;, "Chuseishi Soft-Error Simulation no Shintenkai"; IEICE Technical Report, The Institute of Electronics Information and Communication Engineers, Apr. 15, 2005, vol. 105, No. 2, pp. 37 to 42 (ICD2005-19).

P. Shivakumar et al.; Modeling the Effect of Technology Trends on the Soft Error Rate of Combination Logic, Proceedings of the International Conference on Dependable Systems and Networks, IEEE, Jun. 26, 2002, pp. 389 to 398.

S. Krishnamohan et al.; "Combining Error Masking and Error Detection Plus Recovery to Combat Soft Errors in Static CMOS Circuits"; Proceedings of the 2005 International Conference on Dependable Systems and Networks, IEEE, Jul. 1, 2005, pp. 40 to 49.

N. Seifert et al.; "Timing Vulnerability Factors of Sequentials"; IEEE, Transactions on Device and Materials Reliability, IEEE, Sep. 2004, vol. 4, No. 3, pp. 516 to 522.

R. Ramanarayanan et al.; "Analysis of Soft Error Rate in Flip-Flops and Scannable Latches, Proceedings", IEEE Intenational SOC Conference, IEEE, Sep. 20, 2003, pp. 231 to 234.

International Search Report of PCT/JP2005/017445, date of mailing Nov. 8, 2005.

Japanese Office Action dated Oct. 28, 2008, issued in corresponding Japanese Patent Application No. 2007-536369.

Chinese Office Action dated Jan. 26, 2011, issued in corresponding Chinese Patent Application No. 201010212828.5.

* cited by examiner

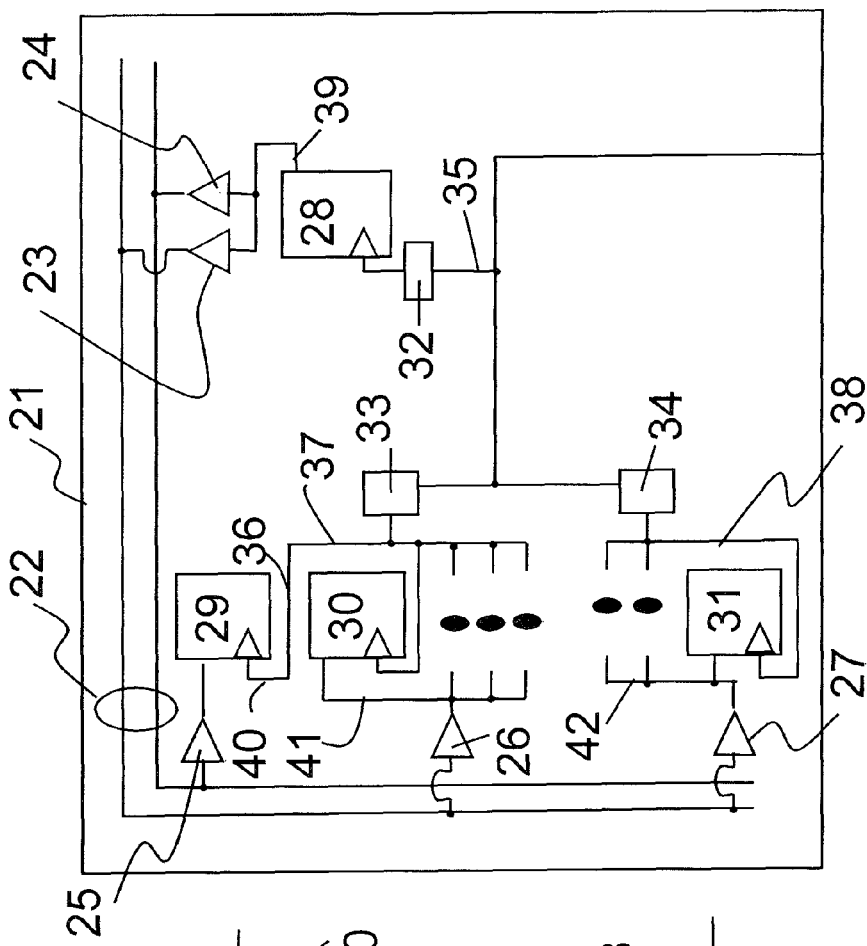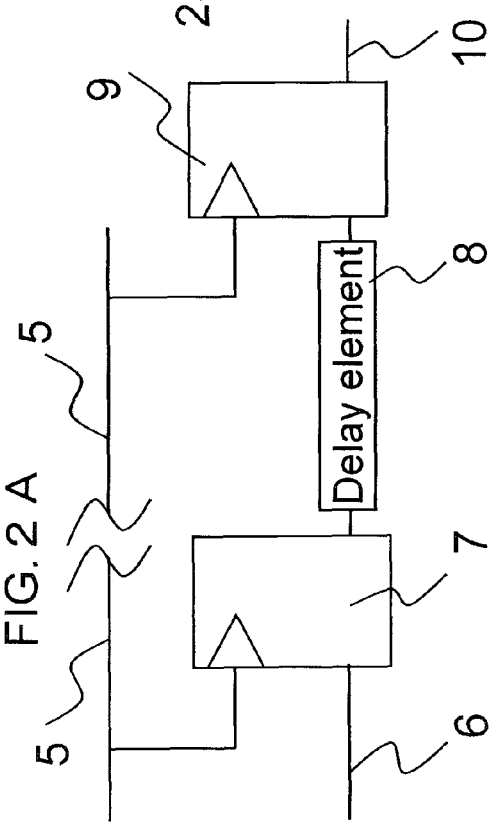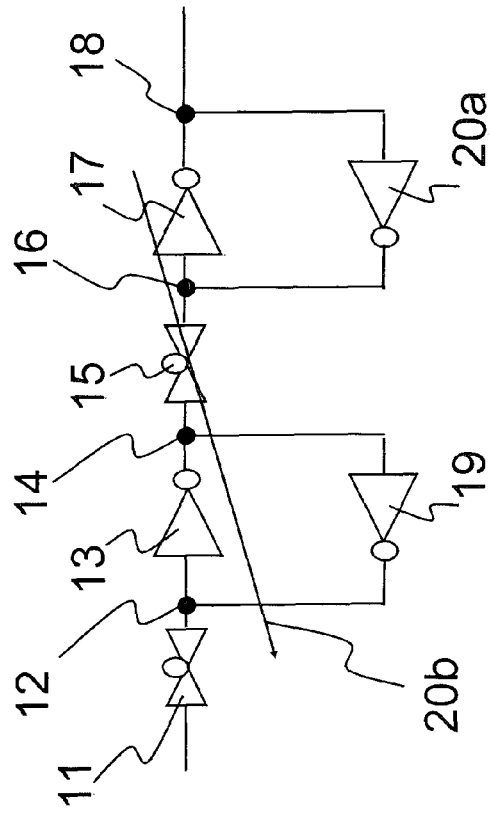

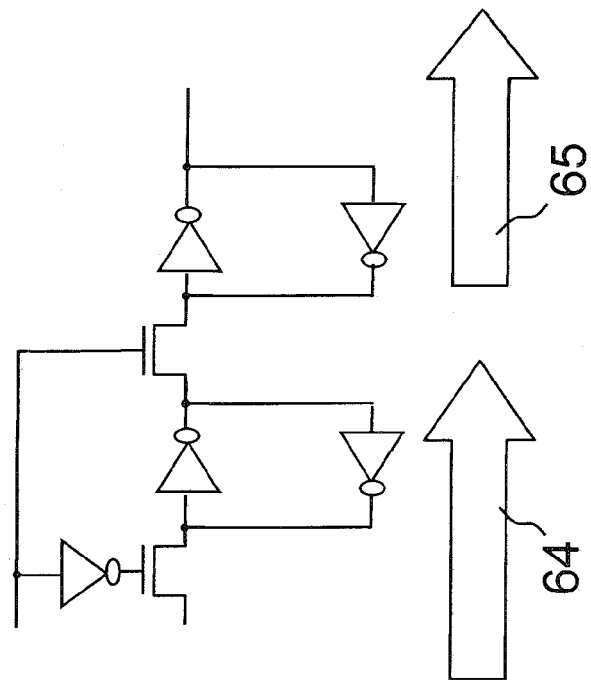
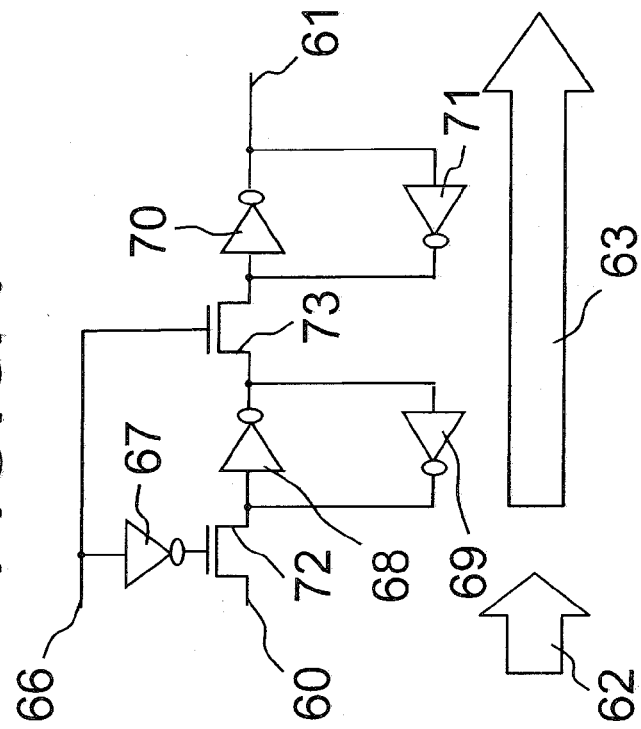

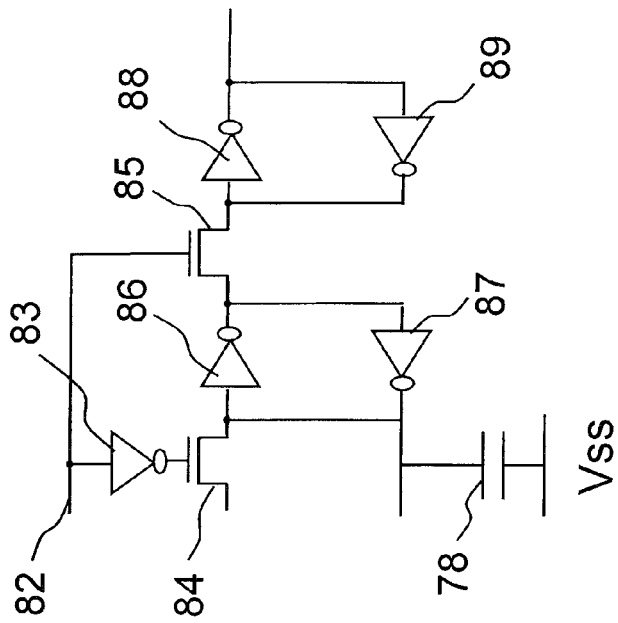
FIG.7C
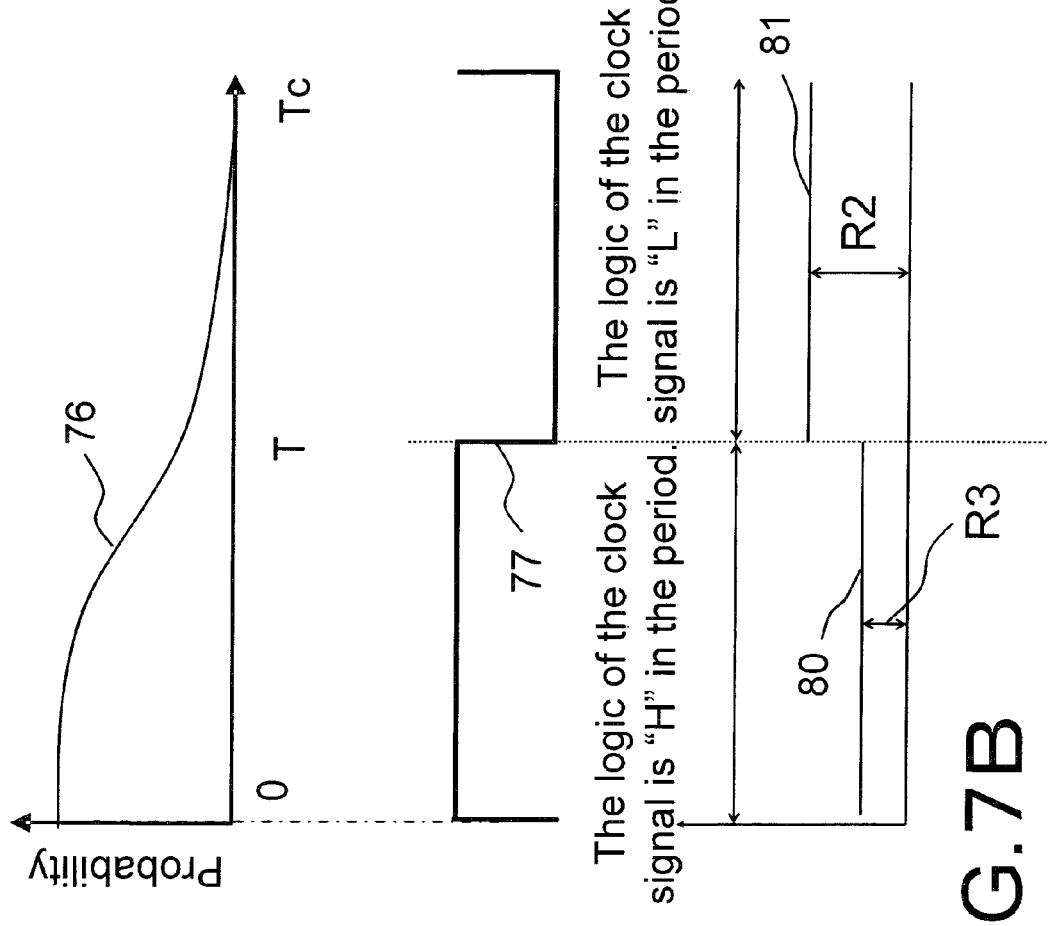
FIG.7A
FIG.7B

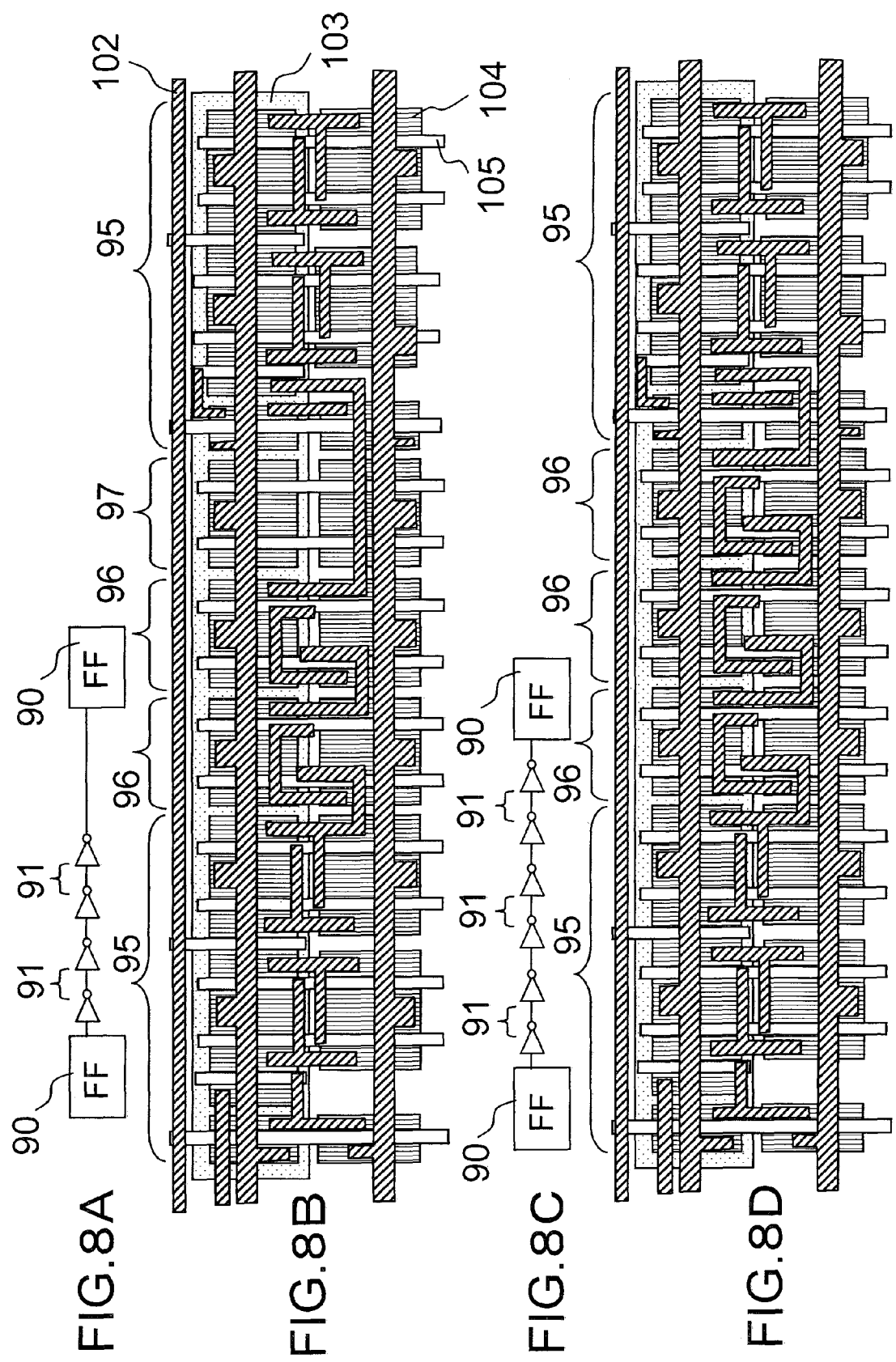

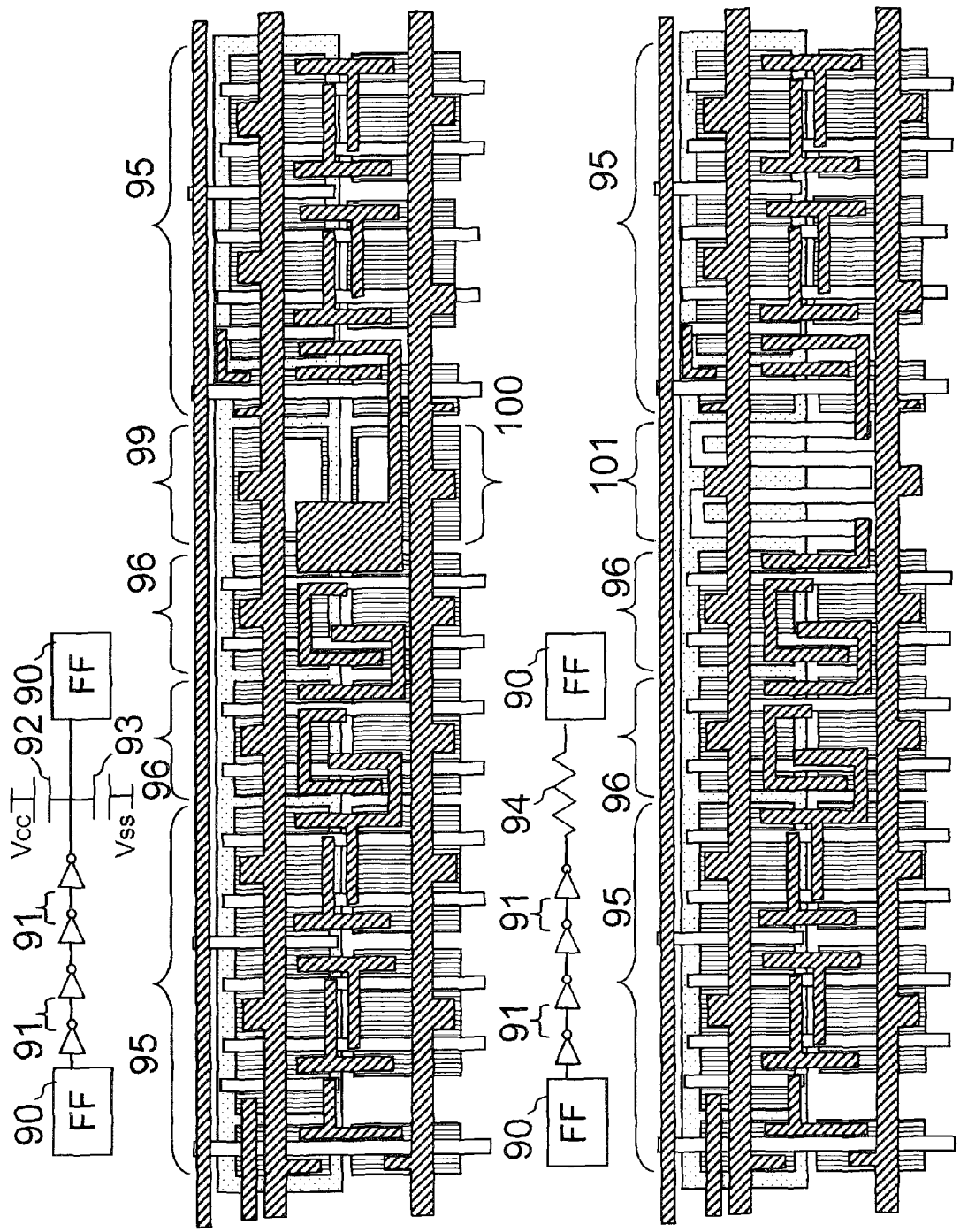

SIGNAL TRANSMISSION CIRCUIT FOR INCREASING SOFT ERROR TOLERANCE

TECHNICAL FIELD

The present invention relates to a signal transmission circuit in which soft error tolerance is improved, a semiconductor circuit device that includes the circuit, a method for designing a semiconductor circuit device in which soft error tolerance is improved, and a CAD device for implementing the method.

BACKGROUND

It is known that electrical noise occurs in large scale integration (LSI) semiconductor circuits due to alpha rays that occur when radioactive isotopes included in, for example, LSI packages or wiring decay, neutrons from cosmic rays, and the like, so that the semiconductor circuits malfunction. The aforementioned malfunction is called a soft error as opposed to a hard error due to a malfunction of hardware such as a semiconductor circuit. In dynamic random memories (DRAMs) and static random memories (SRAMs) memory elements of which have a small charge capacity, safeguards against soft errors have been considered from a long time ago. On the other hand, in logic LSIs, since the charge capacity of storage nodes of flip-flop circuits that are used as signal transmission circuits is large, safeguards against soft errors have been seldom considered.

However, as LSIs have been highly integrated and downsized, the charge capacity of storage nodes of flip-flop circuits that are used as signal transmission circuits has decreased. Moreover, LSI semiconductor circuits have come to handle signals having a small logical amplitude. Thus, in large scale integrations that are manufactured using the latest microfabrication technique, it has been found that the soft error rate that is an index of reliability is 1000 FIT (1000 FIT means that one error occurs in one million device (piece)×time (hour)) or more. The aforementioned soft error rate means that any one LSI malfunctions once in one month when 1000 LSIs are shipped.

Accordingly, proposals for improving the soft error tolerance of logic LSI circuits have been made. For example, the following proposal has been made for flip-flop circuits that are used in logic LSI circuits. A proposal (for example, Patent Document 1) has been made, in which the amount of charge collected in a node of a flip-flop circuit due to the incidence of alpha rays on a semiconductor substrate is first calculated, and the critical amount of charge necessary to invert the logic level of the node of the flip-flop circuit is calculated; then, the amount of capacity to be applied to the node of the flip-flop circuit to prevent soft errors when the amount of the collected charge is larger than the critical amount of charge is calculated; and then, the amount of capacity to be applied is applied to the node of the flip-flop circuit.

(Refer to Japanese Laid-open Patent Publication No. 2000-195274)

Adding a capacitance to flip-flop circuits used in signal transmission circuits uniformly to prevent inversion of the logic level in the flip-flop circuits results in a delay in signal transmission in all the signal transmission circuits and thus may result in the whole of a logic LSI circuit being unable to follow a high-speed operation. For example, operation with a clock signal having a predetermined clock frequency may not be guaranteed.

On the other hand, in view of the operation of a signal transmission circuit, it is apparent that, when inversion of the logic level does not occur in a flip-flop circuit, no soft error is recognized. However, even in a case where inversion of the logic level occurs, when it does not happen that a signal the logic level of which is inverted is transferred from a flip-flop circuit in which inversion of the logic level occurs to the next flip-flop circuit and latched, no soft error is recognized. Thus, methods other than the method for adding a capacitance to flip-flop circuits used in signal transmission circuits uniformly may be considered as methods for improving the soft error tolerance.

Moreover, even when a signal the logic level of which is inverted is latched into the next flip-flop circuit, a method for preventing soft errors by performing error checking by taking the parity among the logics of a plurality of signals and retrying instructions exists. However, in the aforementioned method, the performance of a logic LSI circuit is significantly decreased.

SUMMARY

According to one aspect of an embodiment, there is a CAD device having means that determine signal transmission time necessary for each signal transmission circuit in an LSI circuit to transmit a signal, means that detect the longest signal transmission time on the basis of the signal transmission time, means that determine an output inversion rate at which, when a flip-flop circuit that constitutes each signal transmission circuit is exposed to radiation, the logic of an output signal from the flip-flop circuit is inverted on the basis of the amount of charge held in a critical node in the flip-flop circuit, means that calculate a soft error rate of the LSI circuit on the basis of the signal transmission time, an operating clock period, and the output inversion rate of the flip-flop circuit, and means that, when a predetermined soft error rate is less than the soft error rate of the LSI circuit as a result of comparison, modify the LSI circuit so as to reduce the soft error rate of the LSI circuit to the extent possible without changing the longest signal transmission time.

BRIEF DESCRIPTION OF THE DRAWINGS

FIG. 2A shows the details of a step of detecting a critical path.

FIG. 2B shows the details of a step of detecting a critical path.

FIG. 2C shows the details of a step of detecting a critical path.

FIG. 6A shows a mechanism in which the logic of an output signal from a flip-flop is inverted due to noise caused by, for example, alpha rays.

FIG. 6B shows a mechanism in which the logic of an output signal from a flip-flop is inverted due to noise caused by, for example, alpha rays.

FIG. 7A shows a process of reducing a soft error rate of an LSI circuit by making a modification for making the logic of an output signal from a flip-flop included in a communication transmission circuit less prone to being readily inverted due to, for example, noise.

FIG. 7B shows a process of reducing a soft error rate of an LSI circuit by making a modification for making the logic of an output signal from a flip-flop included in a communication transmission circuit less prone to being readily inverted due to, for example, noise.

FIG. 7C shows a process of reducing a soft error rate of an LSI circuit by making a modification for making the logic of an output signal from a flip-flop included in a communication transmission circuit less prone to being readily inverted due to, for example, noise.

FIG. 8A shows a signal transmission circuit that includes a dummy circuit that can be changed to an inverter and thus can change the delay Td.

FIG. 8B shows a signal transmission circuit that includes a dummy circuit that can be changed to an inverter and thus can change the delay Td.

FIG. 8C shows a signal transmission circuit that includes a dummy circuit that can be changed to an inverter and thus can change the delay Td.

FIG. 8D shows a signal transmission circuit that includes a dummy circuit that can be changed to an inverter and thus can change the delay Td.

FIG. 9A shows signal transmission circuits each of which can be modified so as to extend the delay Td by adding capacitances or a resistance.

FIG. 9B shows signal transmission circuits each of which can be modified so as to extend the delay Td by adding capacitances or a resistance.

FIG. 9C shows signal transmission circuits each of which can be modified so as to extend the delay Td by adding capacitances or a resistance.

FIG. 9D shows signal transmission circuits each of which can be modified so as to extend the delay Td by adding capacitances or a resistance.

DESCRIPTION OF THE PREFERRED EMBODIMENTS

First to fourth embodiments will now be described.
First Embodiment

The first embodiment relates to a method for designing a semiconductor device in which soft error tolerance is improved. The aforementioned method for designing a semiconductor device will be described using FIGS. 1, 2A to 2C, 3A to 3C, 4A, 4B, 5A to 5C, 6A, 6B, and 7A to 7C.

Figure 1:
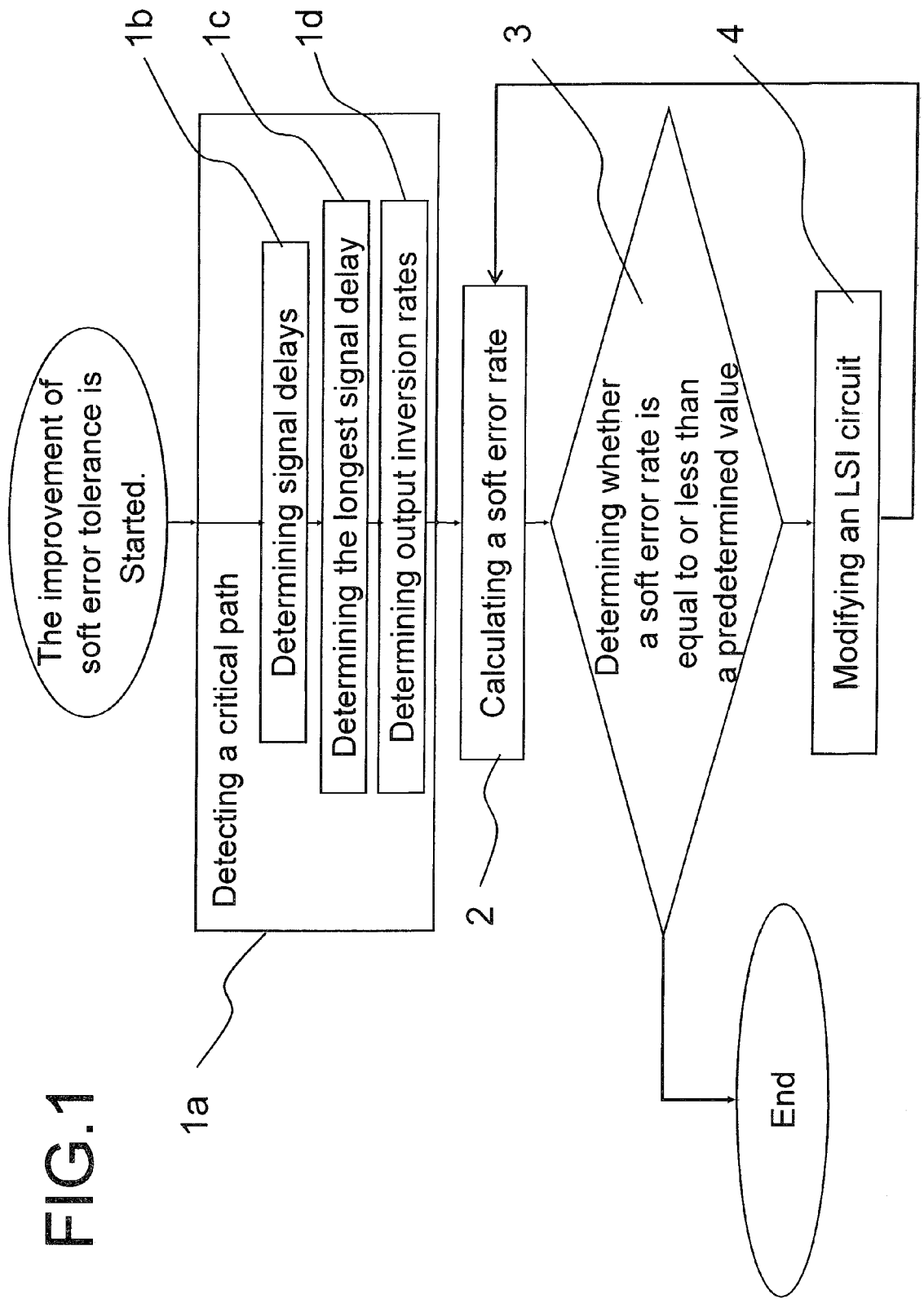
FIG. 1 is a flowchart of a method for designing a semiconductor device in which soft error tolerance is improved.

FIG. 1 is a flowchart of the method for designing a semiconductor device in which soft error tolerance is improved. FIG. 1 shows step 1a of detecting a critical path, step 1b of determining signal delays, step 1c of detecting the longest signal delay, step 1d of determining output inversion rates, step 2 of calculating a soft error rate, step 3 of determining whether a soft error rate is equal to or less than a predetermined value, and step 4 of modifying an LSI circuit so as to reduce a soft error rate.

Step 1a of detecting a critical path is roughly represented as the following step. The details of the embodiment will be described below using FIG. 2. In most cases, an LSI circuit includes combinational circuits each of which includes logic elements and the like and sequential circuits each of which includes flip-flops. In an LSI circuit, a circuit that includes two flip-flop circuits and a delay element that is disposed between the flip-flops and delays a signal from an output terminal of one of the flip-flops and transfers the delayed signal to an input terminal of the other flip-flop is defined as a signal transmission circuit. Moreover, the sum of a gate delay between the time a signal is input to a flip-flop and the time the flip-flop outputs an output signal from an output terminal and transfer time necessary to transfer the output signal to an input terminal of the next flip-flop by the aforementioned delay element is defined as a signal delay Td.

In step 1a of detecting a critical path, signal transmission circuits are first identified. Then, step 1b of determining the signal delay (Td) for each of the signal transmission circuits is performed. Then, step 1c of detecting the longest signal delay by comparing the signal delays Td of the individual signal transmission circuits, considering a clock period Tc of a clock signal supplied to the LSI circuit, is performed. Then, a signal transmission circuit that is a critical path, i.e., that has the longest signal delay is determined. Moreover, step 1d of, for flip-flops in the individual signal transmission circuits, determining respective output inversion rates at which the logic of output signals from the flip-flops is inverted due to alpha rays that occur when radioactive isotopes included in, for example, an LSI package or wiring decay, neutrons from cosmic rays, and the like is performed.

Step 2 of calculating a soft error rate is roughly represented as the following step. The details of the embodiment will be described below using FIGS. 3 and 4. Regarding a signal transmission circuit, it is assumed that the logic of an output signal from a flip-flop is inverted at a time Tf in the clock period Tc, and a signal delay in the signal transmission circuit is Td. Moreover, it is assumed that a probability that the logic of an output signal from the flip-flop is inverted when alpha rays or the like hit the flip-flop is R. In this case, when Tc−Tf is equal to or less than Td, inversion of the logic of an output signal from one flip-flop is transferred to the other flip-flop, so that a soft error occurs. Thus, regarding a signal transmission circuit, a probability P that alpha rays or the like hit the signal transmission circuit, so that an output signal from a flip-flop is inverted and latched into the next flip-flop to cause a soft error, is 1−Td/Tc. This is because, when the logic of an output signal is inverted ahead as much as Td or more before the end point Tc of a clock period, i.e., when the logic of an output signal is inverted during a period (Tc−Td) in the period Tc, a soft error occurs. Moreover, considering the probability R that the logic of an output signal from a flip-flop is inverted, a probability S that a soft error occurs is the product of R and P=(1−Td/Tc).

Thus, when respective soft error probabilities in N signal transmission circuits included in an LSI circuit are $S_1, S_2, \ldots, S_N$, and a probability that alpha rays or the like hit each of the signal transmission circuits is simply 1/N, a total soft error probability in the LSI circuit is $(S_1+S_2+ \ldots +S_N)/N$. Moreover, assuming that the probability R that the logic of an output signal from each flip-flop is inverted is constant, when the probabilities P that output signals from respective flip-flops in individual signal transmission circuits are inverted and latched into the next flip-flops to cause soft errors are $P_1, P_2, \ldots, P_N$, a total soft error probability in an LSI circuit is $R \times (P_1+P_2+ \ldots +P_N)/N$.

Thus, step 2 of calculating a soft error rate is a step of determining a total soft error probability in an LSI circuit, as described above.

Step 3 of determining whether a soft error rate is equal to or less than a predetermined value is a step of determining whether a soft error rate calculated in step 2 of calculating a soft error rate satisfies a given target soft error rate. The details of the embodiment will be described below. When the soft error rate calculated in step 2 of calculating a soft error rate satisfies the target, designing a semiconductor device in which soft error tolerance is improved is completed. On the other hand, when the soft error rate calculated in step 2 of calculating a soft error rate does not satisfy the target, the process proceeds to step 4 of modifying an LSI circuit so as to reduce a soft error rate.

Step 4 of modifying an LSI circuit so as to reduce a soft error rate is a step of modifying an LSI circuit by modifying, for example, signal transmission circuits included in the LSI circuit or flip-flops included in the signal transmission circuits so as to reduce a soft error rate calculated in step 2 of calculating a soft error rate. The details of the embodiment will be described below using FIGS. 5 and 6.

FIGS. 2A, 2B, and 2C show the details of the step of detecting a critical path.

FIG. 2A shows a signal transmission circuit. FIG. 2A shows a clock signal line 5, an input signal line 6, a flip-flop 7, a delay element 8, a flip-flop 9, and an output signal line 10. The signal transmission circuit in FIG. 2A includes the flip-flop 7, the flip-flop 9, and the delay element 8. The delay element 8 is connected between an output terminal of the flip-flop 7 and an input terminal of the flip-flop 9. Moreover, the delay element 8 can change the transfer time necessary to transfer a signal from the output terminal of the flip-flop 7 to the input terminal of the flip-flop 9. The flip-flop 7 receives an input signal from the input signal line 6 at the input terminal, latches the input signal upon receiving a clock signal from the clock signal line 5, and then outputs an output signal from the output terminal. The operation of the flip-flop 9 is similar to that of the flip-flop 7. However, the flip-flop 9 is different from the flip-flop 7 in that the flip-flop 9 receives a signal from the delay element 8 at the input terminal.

FIG. 2B shows the detailed circuit structure of the flip-flop 7 or the flip-flop 9. FIG. 2B shows transfer gates 11 and 15, a node A 12, inverters 13, 17, 19, and 20a, a node B 14, a node C 16, a node D 18, and an arrow 20b that indicates alpha rays and the like. The inverters 13 and 19 are connected in a loop and constitute a master flip-flop circuit. The inverters 17 and 20a are connected in a loop and constitute a slave flip-flop circuit. The transfer gate 11 is a circuit that brings an input signal into the flip-flop 7 or the flip-flop 9. The transfer gate 15 is a circuit that transfers a signal from the master flip-flop circuit to the slave flip-flop circuit. The nodes A 12, B 14, C 16, and D 18 are places where noise that can invert the logic of an output signal from the flip-flop 7 or the flip-flop 9 when alpha rays or the like indicated by the arrow 20b occur is generated, and are called critical nodes.

FIG. 2C shows the outline of an LSI circuit. FIG. 2C shows an LSI circuit 21, a bus wiring line 22, delay elements 23, 24, 25, 26, and 27, flip-flop circuits 28, 29, 30, and 31, clock buffers 32, 33, and 34 that constitute a clock tree, a clock A 35 that is generated from the clock buffer 32, a clock B 36 that is generated from the clock buffer 33 and supplied to the flip-flop 29, a clock C 37 that is generated from the clock buffer 33 and supplied to the flip-flop 30, a clock D 38 that is generated from the clock buffer 34, and signals A 39, B 40, C 41, and D 42.

The LSI circuit 21 includes combinational circuits and sequential circuits each of which includes flip-flops and the like. The LSI circuit 21 includes functional circuit blocks for implementing functions of the LSI circuit 21, for example, a circuit block that includes the flip-flop 28, a circuit block that includes the flip-flop 29, a circuit block that includes the flip-flop 30, and a circuit block that includes the flip-flop 31. The flip-flop 28 outputs the signal A 39 upon receiving the clock A 35 from the clock buffer 32. The signal A 39 is transferred to an input terminal of the flip-flop 29 as the signal B 40 via the delay element 24, the bus wiring line 22, and the delay element 25. Moreover, the signal A 39 is transferred to an input terminal of the flip-flop 30 as the signal C 41 via the delay element 23, the bus wiring line 22, and the delay element 26. Moreover, the signal A 39 is transferred to an input terminal of the flip-flop 31 as the signal D 42 via the delay element 23, the bus wiring line 22, and the delay element 27. The flip-flop 29 latches the signal B 40 upon receiving the clock B 36 from the clock buffer 33. The flip-flop 30 latches the signal C 41 upon receiving the clock C 37 from the clock buffer 33. The flip-flop 31 latches the signal D 42 upon receiving the clock D 38 from the clock buffer 34. That is to say, since the input and output of the signals A 39, B 40, C 41, and D 42 and the like between the aforementioned circuit blocks are controlled by the flip-flops 28, 29, 30, and 31, the order in which the individual circuit blocks operate is determined.

"Determining signal transmission circuits" means, for example, in the LSI circuit in FIG. 2C, determining the flip-flops 28 and 29 as the flip-flops in the signal transmission circuit described using FIG. 2A and determining the delay element 24, the bus wiring line 22, and the delay element 25 as the delay element in the signal transmission circuit described using FIG. 2A. That is to say, "determining signal transmission circuits" means determining a flip-flop that outputs a signal, a flip-flop that latches the signal, and a delay element between the flip-flops in each sequential circuit in an LSI circuit.

"The step of determining the signal delay Td for each of the signal transmission circuits" means, for example, in a signal transmission circuit that includes the flip-flops 28 and 29 and a delay element that includes the delay element 24, the bus wiring line 22, and the delay element 25, determining, as the signal delay Td, the time in which a signal is input to the flip-flop 28, the flip-flop 28 outputs an output signal, and then the output signal from the flip-flop 28 reaches the input terminal of the flip-flop 29 via the delay element. That is to say, it means determining, as the signal delay Td, the time between when one flip-flop in a signal transmission circuit receives a signal and when the signal is transferred to an output terminal of the other flip-flop. Specifically, the signal delay Td can be determined from the drive capability of flip-flops, wiring resistance, and the drive capability of a delay element by a known circuit simulation.

"The step of detecting the longest signal delay by comparing the signal delays Td of the individual signal transmission circuits, considering a clock period Tc of a clock signal supplied to the LSI circuit" means a step of detecting the longest signal delay Td by comparing the signal delays Td of individual signal transmission circuits. Then, a signal transmission circuit that has the longest signal delay is determined as a critical path. In this case, "considering a clock period Tc of a clock signal" means, when the sum of the longest signal delay Td, setup time in flip-flops, and hold time in the flip-flops exceeds the clock period Tc, not determining a signal transmission circuit that has the longest signal delay Td as a critical path. This is because, in principle, when any one of the signal delays Td of individual signal transmission circuits exceeds the clock period Tc, a corresponding LSI circuit to which the clock signal is supplied does not operate with the clock period, and thus a signal transmission circuit that has the signal delay Td exceeding the clock period Tc is modified so that the signal delay Td is equal to or less than Tc.

"The step of, for flip-flops in the individual signal transmission circuits, determining respective output inversion rates at which the logic of output signals from the flip-flops is inverted due to alpha rays that occur when radioactive isotopes included in, for example, an LSI package or wiring decay, neutrons from cosmic rays, and the like" means, on the basis of the rates of occurrence of alpha rays, neutrons, and the like, the distribution of the amounts of charge generated due to alpha rays, neutrons, and the like, and the amounts of charge borne by critical nodes in a flip-flop in each signal transmission circuit, for example, the nodes A 12, B 14, C 16, and D 18, determining an output inversion rate at which the logic of an output signal from the flip-flop is inverted. Thus, the lower the rates of occurrence of alpha rays, neutrons, and the like, the lower the output inversion rate. Moreover, when the distribution of the amounts of charge generated due to alpha rays, neutrons, and the like is biased to small amounts of charge, the output inversion rate is low. Moreover, the larger the amounts of charge borne by critical nodes, the lower the output inversion rate.

Figure 3A:
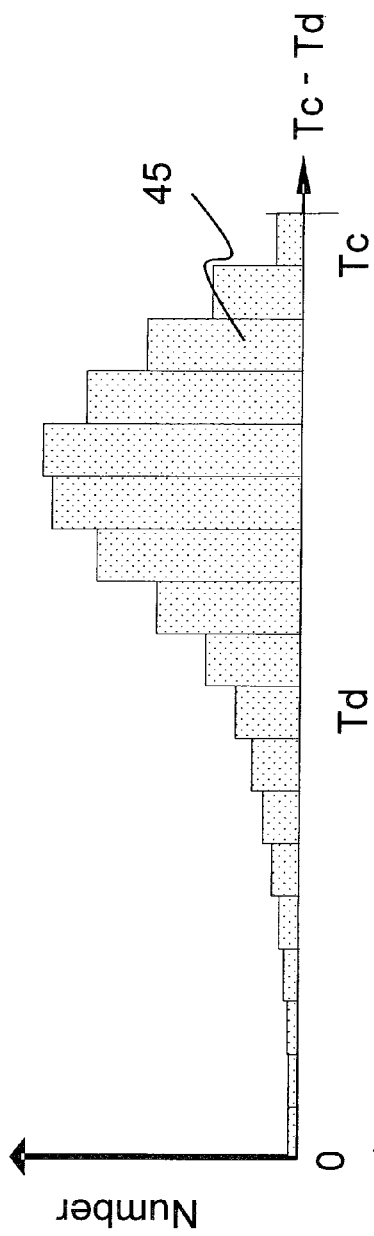
FIG. 3A shows the details of a step of calculating a soft error rate and a step of making determination on a soft error rate.
Figure 3B:
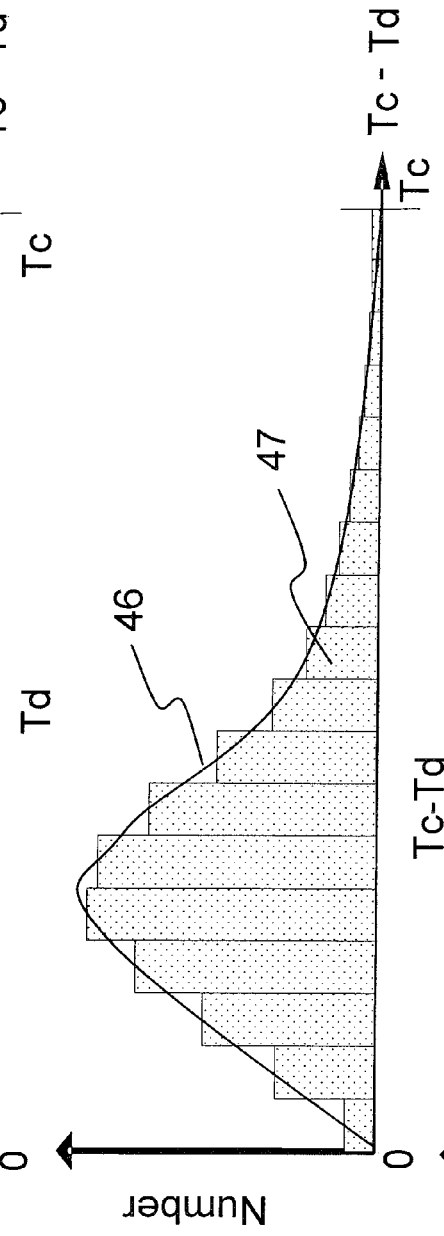
FIG. 3B shows the details of a step of calculating a soft error rate and a step of making determination on a soft error rate.
Figure 3C:
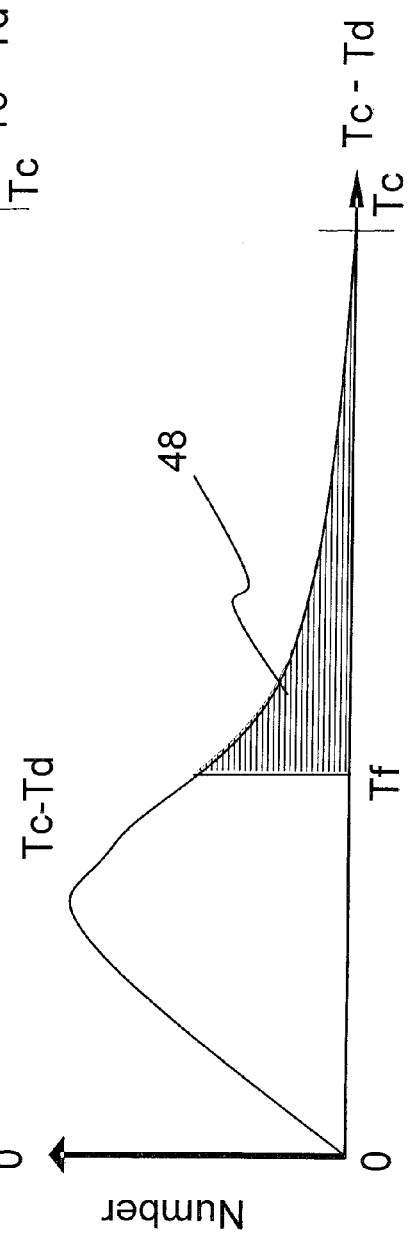
FIG. 3C shows the details of a step of calculating a soft error rate and a step of making determination on a soft error rate.

FIGS. 3A, 3B, 3C, 4A, and 4B show the details of the step of calculating a soft error rate and the step of making determination on a soft error rate. FIGS. 3A, 3B, and 3C show a frequency distribution 45, a frequency distribution 46, a frequency distribution function 47, and a region 48, in the frequency distribution, indicating the number of signal transmission circuits in which soft errors probably occur.

FIG. 3A shows the frequency distribution 45. In an LSI circuit, the delays Td of signal transmission circuits are classified into classes, the signal transmission circuits are classified so as to correspond to the classes of the delays Td, and then the frequency distribution 45 is created regarding the classes of the delays Td and the frequency of signal transmission circuits that belong to each of the classes of the delays Td. The abscissa and ordinate of the frequency distribution 45 in FIG. 3A indicate the classes of the delays Td and the numbers of signal transmission circuits, respectively. According to the frequency distribution 45 in FIG. 3A, the frequency of signal transmission circuits that belong to the class of the delays Td that are about three-fourths of the clock period Tc is largest.

FIG. 3B shows the frequency distribution 46. The frequency distribution 46 is created on the basis of the frequency distribution 45 in FIG. 3A, transforming the parameter of the abscissa of the frequency distribution in FIG. 3A to (Tc−Td). The ordinate indicates the frequencies of signal transmission circuits. Moreover, FIG. 3B shows the frequency distribution function D(t=Tc−Td) 47, assuming that the frequency distribution of signal transmission circuits is continuous with respect to the parameter (Tc−Td). According to the frequency distribution in FIG. 3B, the frequency of signal transmission circuits that belong to the class of (Tc−Td) that is about a fourth of the clock period Tc is largest.

FIG. 3C is a graph showing the frequency distribution function D(t=Tc−Td) 47 in FIG. 3B. The abscissa and ordinate of the graph in FIG. 3C indicate t=Tc−Td and the frequencies of signal transmission circuits, respectively. A region hatched with oblique lines in FIG. 3C indicates the number of signal transmission circuits in each of which, when Tf has elapsed after the clock edge of a clock signal reaches one flip-flop in the signal transmission circuit, noise occurs due to, for example, alpha rays, and thus the logic of an output signal from the one flip-flop is inverted, so that the output signal the logic of which is inverted is probably transferred to the other flip-flop and latched.

Figures 4A, 4B:
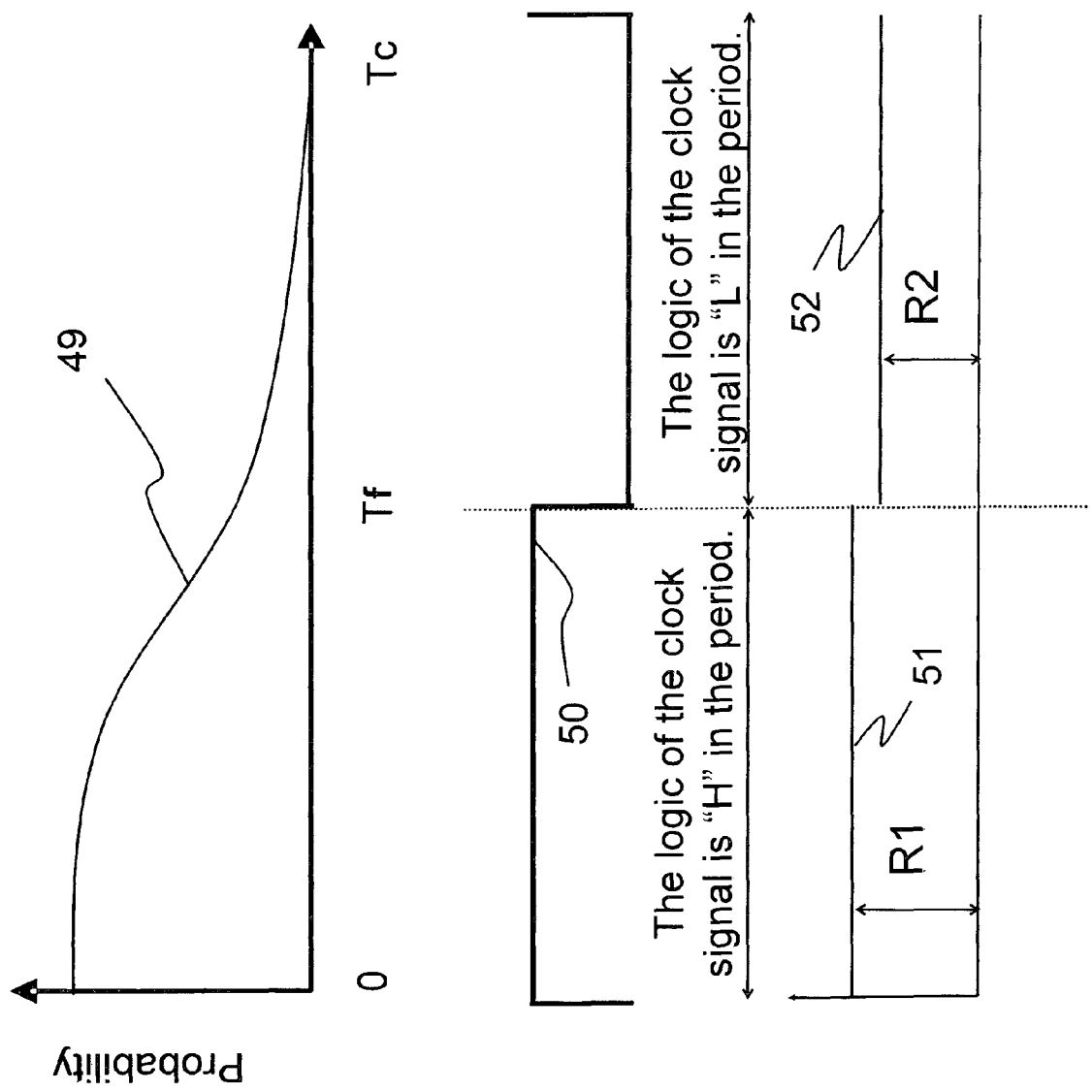
FIG. 4A shows the details of a step of calculating a soft error rate and a step of making determination on a soft error rate.
FIG. 4B shows the details of a step of calculating a soft error rate and a step of making determination on a soft error rate.

Assuming that the time noise occurs due to, for example, alpha rays is Tf, the number of signal transmission circuits in which soft errors probably occur is determined on the basis of a region in the frequency distribution function where Tc−Td>Tf, and a function of Tf, i.e., the result of dividing the integral of the function D(t) from Tf to Tc by the clock period Tc and the total number N of the signal transmission circuits included in the LSI circuit, is defined. FIG. 4A shows this function as a graph. The abscissa and ordinate of FIG. 4A indicate Tc−Td and probabilities, respectively. FIG. 4A shows a line 49 that indicates the result of dividing the integral of the function D(t) from Tf to Tc by Tc and N.

FIG. 4B is a graph showing that, when the status of a clock signal is "H", the probability (hereinafter called the inversion probability of an output signal from a flip-flop) that the logic of an output signal from a flip-flop is inverted due to noise caused by, for example, alpha rays is R1; and when the status of a clock signal is "L", the inversion probability of an output signal from a flip-flop is R2. The ordinate and abscissa of the graph in FIG. 4B indicate numbers and time, respectively. FIG. 4B shows a clock signal 50, a line 51 that indicates the inversion probability of an output signal from a flip-flop when the status of the clock signal is "H", and a line 52 that indicates the inversion probability of an output signal from a flip-flop when the status of the clock signal is "L".

In this case, in general, the inversion probability R1 is higher than the inversion probability R2, as described below using FIGS. 6A and 6B.

The details of the step of calculating a soft error rate are as follows: It is first assumed that a plurality of signal transmission circuits that have the same delay Td exist in an LSI circuit, and the frequency distribution is represented by the graph in FIG. 3A. Then, t is defined by an equation t=Tc−Td, and the frequency distribution in FIG. 3B is created regarding the parameter t on the basis of the frequency distribution in FIG. 3A. Then, the frequency distribution function D(t) in FIG. 3C is created from the frequency distribution in FIG. 3B.

Then, the number of signal transmission circuits (hereinafter called signal transmission circuits in which an inverted signal is probably latched) in each of which noise due to, for example, alpha rays occurs at the time Tf, and thus the logic of an output signal from one flip-flop is inverted, so that the output signal is probably latched into the other flip-flop is calculated using the function D(t=Tc−Td), which represents the frequency of communication transmission circuits that have Tc−Td, as in the graph in FIG. 3C, and represented as follows:

$$\int_{Tf}^{Tc} D(t) \cdot dt \quad [E1]$$

In this case, the reason why the number of signal transmission circuit in which an inverted signal is probably latched, i.e., the number of signal transmission circuits in which soft errors probably occur, is represented by the foregoing equation is that, in a case where Tc−Td>Tf, when noise occurs due to, for example, alpha rays, inversion of an output signal from a flip-flop is transferred to the next flip-flop; and in a case where Tc−Td<Tf, inversion of an output signal from a flip-flop is not transferred. Dividing the aforementioned number of signal transmission circuits in which an inverted signal is probably latched by the clock period Tc and the total number N in the LSI results in the probability that the logic of an output signal is inverted in one flip-flop in a signal transmission circuit, so that the other flip-flop in the signal transmission circuit latches the output signal, as shown in the graph in FIG. 4A.

Then, when noise occurs due to, for example, alpha rays during a period in which the status of the clock signal is "H" and when the inversion probability of an output signal from a flip-flop is R1, as shown in FIG. 4B, the total soft error rate of an LSI circuit is determined on the basis of the aforementioned number of signal transmission circuits in which an inverted signal is probably latched. In this case, since the total soft error rate of an LSI circuit is R×($P_1$+$P_2$+ ... +$P_N$)/N, a soft error rate in a case where noise occurs due to, for example, alpha rays during a period in which the status of the clock signal is "H" is represented by the following equation:

$$(R1/Tc/N) \times \sum_{n}^{tH>n\Delta Tf} \Delta Tf \cdot \int_{n\Delta Tf}^{(n+1)\Delta Tf} D(t) \cdot dt \quad [E2]$$

In the equation described above, tH is a period in which the logic of the clock signal is "H". ΔTf is an infinitesimal interval near the time Tf when noise occurs due to, for example, alpha rays. Even when noise occurs due to, for example, alpha rays in this interval, the soft error rate is considered to be almost the same and not to change. ΔTf is also an interval obtained by dividing a clock period by n. Moreover, in the process of calculating the total sum, i.e., the summation process, setting tH>nΔTf means calculating the total sum for tH, i.e., a period in which the logic of the clock signal is "H".

On the other hand, when noise occurs due to, for example, alpha rays during a period in which the status of the clock signal is "L" and when the inversion probability of an output signal from a flip-flop is R2, as shown in FIG. 4B, a soft error rate is represented as follows. In this case, in the process of calculating the total sum, i.e., the summation process, setting nΔTf>tH means calculating the total sum for tH, i.e., a period in which the status of the clock signal is "L" after the period, in which the logic of the clock signal is "H".

$$(R2/Tc/N) \times \sum_{n}^{n\Delta Tf>tH} \Delta Tf \cdot \int_{n\Delta Tf}^{(n+1)\Delta Tf} D(t) \cdot dt \quad [E3]$$

Thus, a total soft error rate SS in the LSI circuit for the whole of the clock period is calculated as follows:

$$SS = (R1/Tc/N) \times \sum_{n}^{tH>n\Delta Tf} \Delta Tf \cdot \int_{n\Delta Tf}^{(n+1)\Delta Tf} D(t) \cdot dt + \quad [E4]$$

$$(R2/Tc/N) \times \sum_{n}^{n\Delta Tf>tH} \Delta Tf \cdot \int_{n\Delta Tf}^{(n+1)\Delta Tf} D(t) \cdot dt$$

Next, the step of determining whether a soft error rate is equal to or less than a predetermined value is a step of comparing the aforementioned soft error rate SS calculated in the step of calculating the total soft error rate of an LSI circuit with the designed total soft error rate of an LSI circuit that is predetermined. When the soft error rate SS does not satisfy the designed soft error rate for the whole of the clock period as the result, the process proceeds to the step of modifying an LSI circuit so as to reduce the soft error rate. When the soft error rate SS satisfies the designed soft error rate, the designing process for improving the soft error tolerance of LSI circuits is completed.

FIGS. 5A, 5B, 5C, 6A, 6B, 7A, 7B, and 7C show the step of modifying an LSI circuit so as to reduce the total soft error rate of the LSI circuit. Here, modifying an LSI circuit means, for example, modifying an LSI circuit so as to extend the signal delays of delay elements in communication transmission circuits included in the LSI circuit or modifying the circuits of flip-flops included in communication transmission circuits so that the logic of output signals from the flip-flops are not readily inverted due to, for example, noise.

Figure 5A:
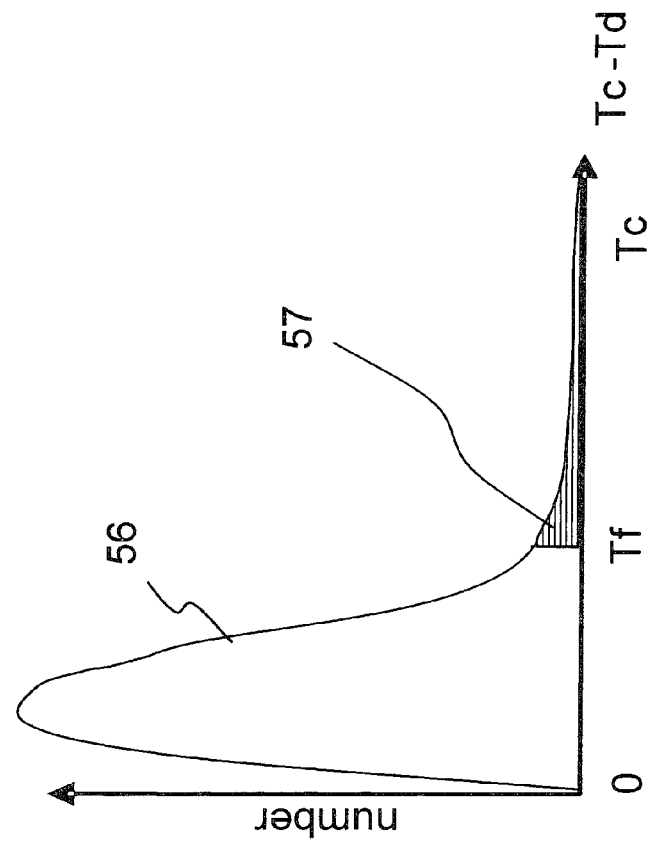
FIG. 5A shows a process of reducing a soft error rate of an LSI circuit by modifying a signal transmission circuit, especially making a modification for extending a signal delay Td of a delay element in the signal transmission circuit.
Figure 5B:
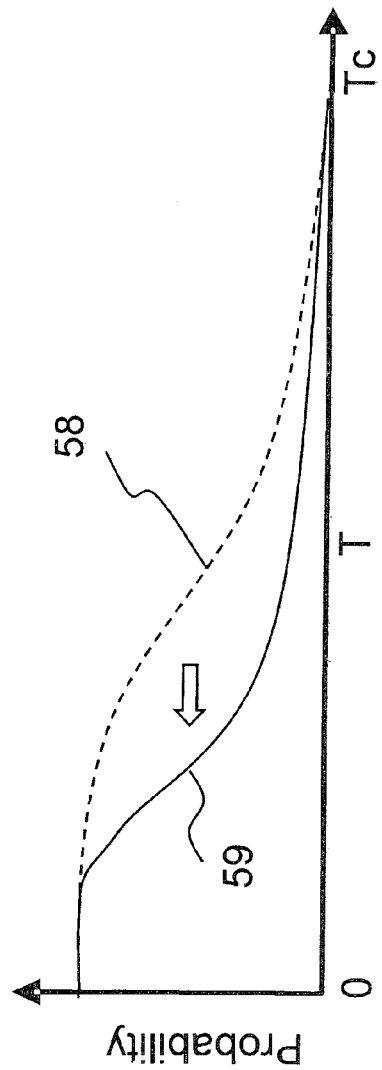
FIG. 5B shows a process of reducing a soft error rate of an LSI circuit by modifying a signal transmission circuit, especially making a modification for extending a signal delay Td of a delay element in the signal transmission circuit.
Figure 5C:
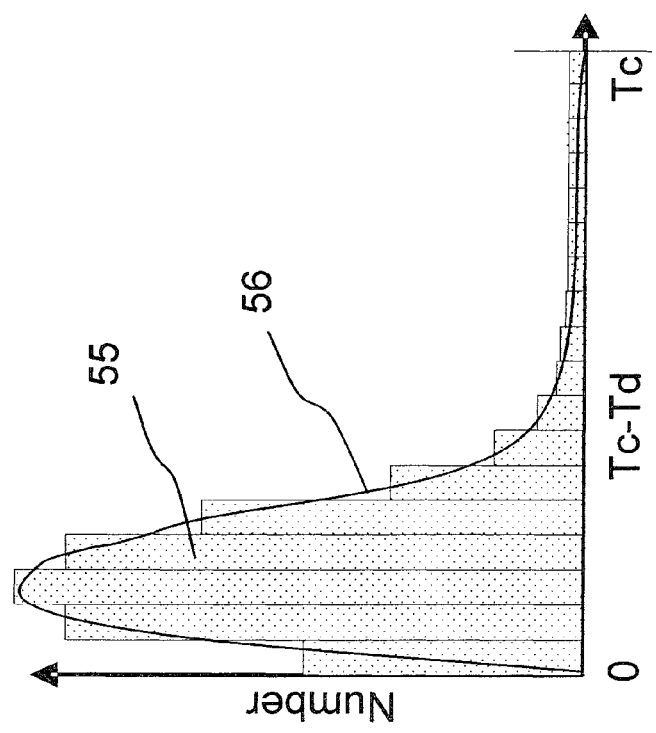
FIG. 5C shows a process of reducing a soft error rate of an LSI circuit by modifying a signal transmission circuit, especially making a modification for extending a signal delay Td of a delay element in the signal transmission circuit.

FIGS. 5A, 5B, and 5C show a process of reducing the soft error rate of an LSI circuit by modifying signal transmission circuits, especially a modification such that the signal delays Td of delay elements in signal transmission circuits are extended. FIGS. 5A, 5B, and 5C show a frequency distribution 55, a frequency distribution function D(t) 56, a region 57 that indicates the number of signal transmission circuits in which soft errors probably occur, the number of signal transmission circuits being determined on the basis of the frequency distribution function 56, a function that represents the result of dividing the number of signal transmission circuits that have not been modified, in which soft errors occur at the time Tf when noise due to, for example, alpha rays occurs, by the total number N of signal transmission circuits, i.e., a function 58 that represents the result of dividing the integral of the frequency distribution function D(t) in FIG. 3C from Tf to Tc by the total number of signal transmission circuits, and a function that represents the result of dividing the number of signal transmission circuits that have been modified, in which soft errors occur at the time Tf when noise due to, for example, alpha rays occurs, by the total number of signal transmission circuits, i.e., a function 59 that represents the result of dividing a function obtained as the result of integration of the frequency distribution function D(t) 56 from Tf to Tc by the total number of signal transmission circuits.

FIG. 5A is a graph similar to FIG. 3B. However, FIG. 5A is different from FIG. 3B in that FIG. 5A shows the frequency distribution of signal transmission circuits regarding signal transmission circuits that have been modified so as to extend the signal delays Td between flip-flops.

FIG. 5B is a graph similar to FIG. 3C. However, FIG. 5B is different from FIG. 3C in that FIG. 5B shows a region that represents the number of signal transmission circuits that have been modified, in which soft errors occur when noise due to, for example, alpha rays occurs at the time Tf.

FIG. 5C is a graph showing functions each of which indicates the result of dividing the number of signal transmission circuits in which soft errors occur at the time Tf when noise due to, for example, alpha rays occurs by the total number of signal transmission circuits, the functions being obtained before and after the signal transmission circuits are modified. That is to say, FIG. 5C is a graph showing total rates of soft errors (hereinafter called a rate of soft errors due to transmission of an inverted signal) in an LSI circuit caused by, when the logic of an output signal from one flip-flop in a signal transmission function is inverted due to occurrence of noise caused by, for example, alpha rays, latching of the signal the logic of which is inverted by the other flip-flop, the total rates of soft errors being obtained before and after the signal transmission circuits are modified.

The modification such that the signal delays Td of delay elements in signal transmission circuits are extended means making a modification so as to extend the signal delays Td by adding or modifying delay elements in individual signal transmission circuits. In this case, needless to say, the signal delays Td are extended within the signal delay Td of a signal transmission circuit that is determined as a critical path, i.e., the longest signal transmission time. This is because the overall performance of an LSI circuit decreases.

That is to say, it means changing the frequency distribution of signal transmission circuits corresponding to (Tc−Td) so as to increase the frequency of signal transmission circuits in a region where Tc−Td is small, as viewed from the viewpoint of the whole of an LSI circuit, as shown in FIG. 5A. As the result, the area of the region in FIG. 5B, which represents the number of signal transmission circuits that have been modified, in which soft errors occur when noise due to, for example, alpha rays occurs at the time Tf, is smaller than the area of the region in FIG. 3C, which indicates the number of signal transmission circuits. Thus, since the number of signal transmission circuits in which soft errors occur decreases, the total soft error rate of an LSI circuit decreases, as shown in FIG. 5C.

FIG. 6A shows a mechanism in which, when the status of a clock signal is "H", the logic of an output signal from a flip-flop is inverted due to noise caused by, for example, alpha rays. FIG. 6B shows a mechanism in which, when the status of a clock signal is "L", the logic of an output signal from a flip-flop is inverted due to noise caused by, for example, alpha rays. FIGS. 6A and 6B show transfer gates 72 and 73, inverters 67, 68, 69, 70, and 71, a clock signal 66, an input terminal 60, an output terminal 61, and arrows 62, 63, 64, and 65 that indicate the flows of signals. Since the structures of flip-flops in FIG. 6A and flip-flops in FIG. 6B are similar to each other, regarding transfers, inverters, and the like, the same numbers are assigned.

According to FIG. 6A, when the logic of the clock signal 66 is "H", the transfer gate 72, the logic "L" being transferred to the gate of the transfer gate 72 by the inverter 67, is closed and does not receive a signal indicated by the arrow 62 from the input terminal 60. However, the transfer gate 73 is open, and thus a signal indicated by the arrow 63 from a master flip-flop that includes the inverters 68 and 69 is transferred to a slave flip-flop that includes the inverters 70 and 71 and is further transferred to the output terminal 61.

On the other hand, according to FIG. 6B, when the logic of the clock signal 66 is "L", the transfer gate 72, the logic "H" being transferred to the gate of the transfer gate 72 by the inverter 67, is open and receives a signal indicated by the arrow 64 from the input terminal 60. The transfer gate 73 is closed, and thus the signal indicated by the arrow 64 from the master flip-flop, which includes the inverters 68 and 69, is not transferred to the slave flip-flop, which includes the inverters 70 and 71. However, a signal indicated by the arrow 65 is transferred from the aforementioned slave flip-flop to the output terminal 61.

Thus, in the flip-flops shown in FIGS. 6A and 6B, the soft error rate R1 in a case where the logic of the clock signal is "H" is almost the same as the soft error rate of the master flip-flop because inversion of the logic of an output signal from the master flip-flop is transferred to the output terminal as is. On the other hand, the soft error rate R2 in a case where the logic of the clock signal is "L" is almost the same as the soft error rate of the slave flip-flop because inversion of the logic of an output signal from the slave flip-flop is transferred to the output terminal as is.

In this case, in general, elements having a small fan-out are used as inverters that constitute a master flip-flop because only a slave flip-flop needs to be driven. In this arrangement, the amount of charge accumulated in a critical node in the master flip-flop described in FIG. 2B is smaller than the amount of charge accumulated in a critical node in the slave flip-flop. Thus, when noise occurs due to, for example, alpha rays, the probability that an output signal from the master flip-flop is inverted is higher than the probability that an output signal from the slave flip-flop is inverted.

Thus, the soft error rate R1 in a case where the logic of the clock signal is "H" is higher than R2 in a case where the logic of the clock signal is "L".

FIGS. 7A, 7B, and 7C show a process of reducing the soft error rate of an LSI circuit by making a modification such that the logic of an output signal from a flip-flop included in a communication transmission circuit is not readily inverted due to, for example, noise.

FIGS. 7A, 7B, and 7C show a function 76 that represents a rate of soft errors due to transmission of an inverted signal, a clock signal 77, a probability 80 that the logic of an output signal from a flip-flop the circuit of which has been modified is inverted during a period in which the logic of the clock signal 77 is "H", a probability 81 that the logic of an output signal from a flip-flop the circuit of which has been modified is inverted during a period in which the logic of the clock signal 77 is "L", a clock signal line 82, inverters 83, 86, 87, 88, and 89, transfer gates 84 and 85, and a capacitance 78.

FIG. 7A is a graph showing the function 76, which represents a rate of soft errors due to transmission of an inverted signal. FIG. 7B shows that, when the logic of the clock signal 77 is "H" in the clock period, the probability that an output signal from a flip-flop is inverted due to noise caused by, for example, alpha rays is R3; and when the logic of the clock signal 77 is "L" in the clock period, the probability that an output signal from a flip-flop is inverted due to noise caused by, for example, alpha rays is R2. In this case, the probability R3 is lower than the probability R2. FIG. 7C shows the outline of a flip-flop. The flip-flop in FIG. 7C includes the inverters 86 and 87 that constitute a master flip-flop, the inverters 88 and 89 that constitute a slave flip-flop, the transfer gate 84 disposed between an input signal line and the master flip-flop, the transfer transistor 85 disposed between the master flip-flop and the slave flip-flop, the clock line 82, which is directly connected to the gate of the transfer gate 85 and is connected to the gate of the transfer gate 84 via the inverter 83, and the capacitance 78 connected to a critical node in the master flip-flop.

Modifying a circuit so that the logic of an output signal from a flip-flop included in a communication transmission circuit is not readily inverted due to, for example, noise means connecting, for example, the capacitance 78 to the critical node in the master flip-flop, as shown in FIG. 7C, to reduce a logic inversion rate at which the logic of a signal held in the critical node is inverted. As the result, when the logic of the clock signal 77 is "H", the probability that an output signal from a flip-flop is inverted due to noise caused by, for example, alpha rays decreases from the probability R1 in FIG. 4B to the probability R3, as shown in FIG. 7B. Moreover, the probability R1 can be set to a value that is lower than the probability R2. In this arrangement, since the rate of soft errors due to transmission of an inverted signal is high during the period, in which the logic of the clock signal 77 is "H", reducing the probability that an output signal from a flip-flop is inverted during the period, in which the logic of the clock signal 77 is "H", is very effective in reducing the total soft error rate of an LSI circuit, as shown in FIG. 7A.

Moreover, adopting the method for making the logic of a signal held in the critical node in the master flip-flop less prone to being inverted by connecting, for example, the capacitance 78 to the critical node has an effect such that transmission of a signal output from the slave flip-flop is not delayed.

The method according to the first embodiment for designing a semiconductor device in which soft error tolerance is improved includes the step of detecting a critical path, the step of calculating a soft error rate, the step of determining whether a soft error rate is equal to or less than a predetermined value, and the step of modifying an LSI circuit so as to reduce a soft error rate. That is to say, the method according to the first embodiment for designing a semiconductor device in which soft error tolerance is improved includes a step of determining signal transmission time necessary to transmit a signal between flip-flop circuits included in each signal transmission circuit, an output inversion rate in a case where the flip-flop circuits included in each signal transmission circuit are exposed to radiation, and a signal transmission circuit that is a critical path, a step of calculating the total soft error rate of an LSI circuit on the basis of the signal transmission time of each signal transmission circuit, the output inversion rate of the flip-flop circuits, and a clock period, and a step of, when a predetermined soft error rate is less than the total soft error rate of the LSI circuit as the result of comparison, modifying the circuit so as to extend the signal transmission times without changing the signal transmission time of the signal transmission circuit, which is a critical path, and reduce the output inversion rate of the flip-flop circuits.

Thus, in the method according to the first embodiment for designing a semiconductor device in which soft error tolerance is improved, since the signal transmission time of a signal transmission circuit that is a critical path that determines the overall performance of an LSI circuit is not changed, the overall performance of the LSI circuit is not reduced. On the other hand, since the soft error tolerance of each signal transmission circuit is improved by reducing the output inversion rate by extending the signal transmission time, an effect such that the soft error tolerance of an LSI circuit is totally improved is achieved.

Moreover, when the LSI circuit in FIG. 2C is designed using the method according to the first embodiment for designing a semiconductor device in which soft error tolerance is improved, a semiconductor device having a high soft error tolerance can be obtained.

Second Embodiment

A second embodiment relates to signal transmission circuits each of which has a mechanism for adjusting a delay in transmitting a signal from one flip-flop to the other flip-flop and represents examples showing the signal transmission circuits, each of which is modified, using the mechanism, so as to have the same delay Td as a signal transmission circuit that is determined as a critical path. The signal transmission circuits according to the second embodiment will now be described using FIGS. 8A to 8D, 9A to 9D, 10A, and 10B. FIGS. 8A to 8D, 9A to 9D, 10A, and 10B show flip-flops 90, inverters 91, a capacitance 92, a capacitance 93, a resistance 94, flip-flop circuit patterns 95, inverter circuit patterns 96, a dummy circuit pattern 97, a capacitance pattern 99, a capacitance pattern 100, a resistance pattern 101, a wiring pattern 102, a well pattern 103, a field region pattern 104, a gate electrode pattern 105, and an inverter 106 having a small drive capability.

FIGS. 8A to 8D show a signal transmission circuit that includes a dummy circuit that can be changed to an inverter and thus can change the delay Td.

FIG. 8A shows the signal transmission circuit, which has not been modified. The signal transmission circuit in FIG. 8A includes one of the flip-flops 90, which outputs a signal, four ones of the inverters 91, and another one of the flip-flops 90, which receives the signal. In the signal transmission circuit in FIG. 8A, the delay Td in transmitting a signal output from the one flip-flop 90 to the other flip-flop 90 includes a delay in outputting a signal from the one flip-flop 90 and transmission time necessary to transmit the signal via the inverters 91. The delay Td of the signal transmission circuit in FIG. 8A is short compared with the delay Td of a signal transmission circuit that is determined as a critical path in an LSI circuit.

FIG. 8B shows a circuit layout corresponding to the signal transmission circuit in FIG. 8A. The circuit layout in FIG. 8B includes two ones of the flip-flop circuit patterns 95, four ones of the inverter circuit layout patterns 96, and the dummy circuit pattern 97. The circuit patterns 95 and 96 and the dummy circuit pattern 97 include the field region pattern 104, which constitutes MOS transistors, the gate electrode pattern 105, which constitutes MOS transistors, the well pattern 103, which defines an N-well region in which PMOS transistors are formed, and the wiring pattern 102, which represents wiring for connecting the MOS transistors or supplying power to the MOS transistors. The dummy circuit pattern 97 is a circuit pattern that can be changed to two ones of the inverter circuit patterns 96 by changing the shape of the wiring pattern 102. Although it is assumed in FIG. 8B that the dummy circuit pattern 97 can be changed to two ones of the inverter circuit patterns 96, needless to say, the dummy circuit pattern 97 can be constructed so that the dummy circuit pattern 97 can be changed to a larger number of the inverter circuit patterns 96.

FIG. 8C shows the signal transmission circuit, which has been modified. The signal transmission circuit in FIG. 8C is similar to the signal transmission circuit in FIG. 8A. However, the signal transmission circuit in FIG. 8C is different from the signal transmission circuit in FIG. 8A in that the signal transmission circuit in FIG. 8C includes two additional ones of the inverter circuits 91. Moreover, the delay Td of the signal transmission circuit in FIG. 8C is the same as the delay Td of the signal transmission circuit, which is determined as a critical path, by the action of the two ones of the inverter circuits 91.

FIG. 8D shows a circuit layout corresponding to the signal transmission circuit in FIG. 8C. The circuit layout in FIG. 8D is similar to the circuit layout in FIG. 8B. However, the circuit layout in FIG. 8D is different from the circuit layout in FIG. 8B in that, in the circuit layout in FIG. 8D, the dummy circuit pattern 97 is changed to two ones of the inverter circuit layout patterns 96 by changing the shape of the wiring pattern 102 for the dummy circuit pattern 97. In the above description, two ones of the inverter circuit layout patterns 96 are formed. Alternatively, only one of the inverter circuit layouts 96 may be formed by partially changing the wiring pattern 102 for the dummy circuit layout pattern 97.

FIGS. 9A to 9D show signal transmission circuits each of which can be modified so as to extend the delay Td by adding capacitances or a resistance.

FIG. 9A shows the signal transmission circuit, in which the delay Td is extended by adding capacitances. The signal transmission circuit in FIG. 9A is similar to the signal transmission circuit in FIG. 8A. However, the signal transmission circuit in FIG. 9A is different from the signal transmission circuit in FIG. 8A in that the capacitance 92 between a power supply (Vcc) having a high voltage level and a signal line of the signal transmission circuit and the capacitance 93 between a power supply (Vss: ground power supply) having a low voltage level and a signal line of the signal transmission circuit are added in the signal transmission circuit in FIG. 9A. Moreover, the delay Td of the signal transmission circuit in FIG. 9A is the same as the delay Td of the signal transmission circuit, which is determined as a critical path, by the action of the capacitance 92 and the capacitance 93.

FIG. 9B shows a circuit layout corresponding to the signal transmission circuit in FIG. 9A. The circuit layout in FIG. 9A is similar to the circuit layout in FIG. 8B. However, the circuit layout in FIG. 9A is different from the circuit layout in FIG. 8B in that the capacitance pattern 99 corresponding to the capacitance 92 and the capacitance pattern 100 corresponding to the capacitance 93 are provided instead of the dummy circuit pattern 97. The capacitance pattern 99 and the capacitance pattern 100 include the field region pattern 104 and the gate electrode pattern 105. In FIG. 9B, the field electrode pattern 104 or the gate electrode pattern 105 for the capacitance pattern 99 and the capacitance pattern 100 includes a single pattern. Alternatively, the field electrode pattern 104 or the gate electrode pattern 105 may include a plurality of divided patterns.

FIG. 9C shows the signal transmission circuit, in which the delay Td is extended by adding a resistance. The signal transmission circuit in FIG. 9C is similar to the signal transmission circuit in FIG. 8A. However, the signal transmission circuit in FIG. 9C is different from the signal transmission circuit in FIG. 8A in that the resistance 94 is added to a signal line of the signal transmission circuit in series with the inverter circuits 91 in the signal transmission circuit in FIG. 9C. Moreover, the delay Td of the signal transmission circuit in FIG. 9C is the same as the delay Td of the signal transmission circuit, which is determined as a critical path, by the action of the resistance 94.

FIG. 9D shows a circuit layout corresponding to the signal transmission circuit in FIG. 9B. The circuit layout in FIG. 9D is similar to the circuit layout in FIG. 8B. However, the circuit layout in FIG. 9D is different from the circuit layout in FIG. 8B in that, in the circuit layout in FIG. 9D, the resistance pattern 101 corresponding to the resistance 94 is provided instead of the dummy circuit pattern 97. The resistance pattern 101 includes the gate electrode pattern 105. The resistance pattern 101 may include a plurality of divided patterns. Moreover, the resistance value may be adjusted by not using a part of the aforementioned divided patterns.

Figure 10A:
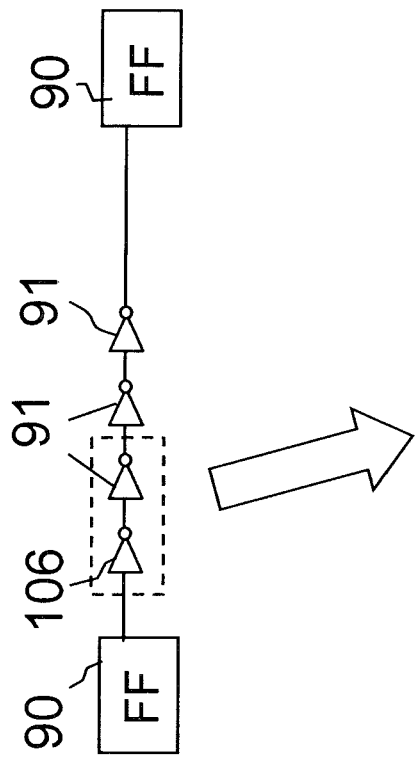
FIG. 10A shows a signal transmission circuit in which the delay Td can be extended by using an inverter having a small drive capability.
Figure 10B:
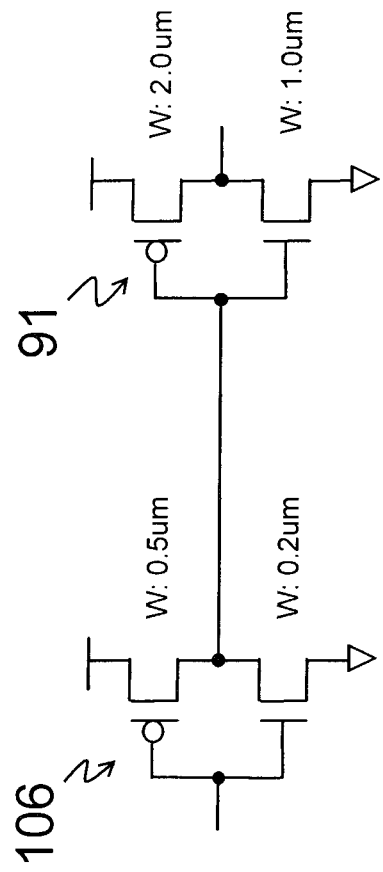
FIG. 10B shows a signal transmission circuit in which the delay Td can be extended by using an inverter having a small drive capability.

FIGS. 10A and 10B show a signal transmission circuit in which the delay Td can be extended by using an inverter having a small drive capability.

FIG. 10A shows the signal transmission circuit, in which the delay Td is extended by using the inverter 106 having a small drive capability. The signal circuit in FIG. 10A is similar to the signal transmission circuit in FIG. 8A. However, the signal circuit in FIG. 10A is different from the signal transmission circuit in FIG. 8A in that the first one of the inverters 91, which constitute a delay element, is replaced with the inverter 106 having a small drive capability. Moreover, the delay Td of the signal transmission circuit in FIG. 10A is the same as the delay Td of the signal transmission circuit, which is determined as a critical path, by the action of the inverter 106 having a small drive capability.

FIG. 10B shows the circuit, in which a part of a delay element includes the inverter 106 having a small drive capability. FIG. 10B shows the inverter 106 having a small drive capability connected in series with the inverters 91. Each of the inverters 91 includes, for example, a PMOS transistor and an NMOS transistor in both of which the width of the field region pattern 104 is 2.0 µm. The inverter 106 having a small drive capability includes, for example, a PMOS transistor in which the width of the field region pattern 104 is 0.5 µm and an NMOS transistor in which the width of the field region pattern 104 is 0.2 µm. Since the inverter 106 having a small drive capability has a small capability to drive a signal, the delay of the inverter 106 having a small drive capability per unit is longer.

The signal transmission circuits according to the second embodiment are characterized in that each of the signal transmission circuits includes a first flip-flop, on the outputting side, that outputs an output signal from an output terminal, a second flip-flop, on the receiving side, that receives the signal from the first flip-flop at an input terminal and latches the signal in response to a clock signal, and a delay element, between the first flip-flop on the outputting side and the second flip-flop on the receiving side, that equalizes the delay Td of each of the signal transmission circuits with the delay Td of a signal transmission circuit that is determined as a critical path.

Thus, the signal transmission circuits according to the second embodiment have an effect such that the soft error rate is low and the overall performance of an LSI circuit is not decreased. This is because, since the delay Td of each of the signal transmission circuits according to the second embodiment is the same as the delay Td of the signal transmission circuit, which is determined as a critical path, the probability that, when inversion of the logic of an output signal from the first flip-flop on the outputting side is caused by noise that occurs due to, for example, alpha rays, the signal the logic of which is inverted reaches the second flip-flop on the receiving side is low. This is also because, since the delay Td of each of the signal transmission circuits according to the second embodiment does not exceed the delay Td of the signal transmission circuit, which is determined as a critical path, the overall performance of an LSI circuit is not decreased.

Third Embodiment

A third embodiment is an example in which a master flip-flop circuit in a flip-flop in a signal transmission circuit is changed to a circuit in which, when noise due to, for example, alpha rays occurs, the logic inversion rate of a held signal is low. The third embodiment will now be described using FIG. 11.

Figure 11:
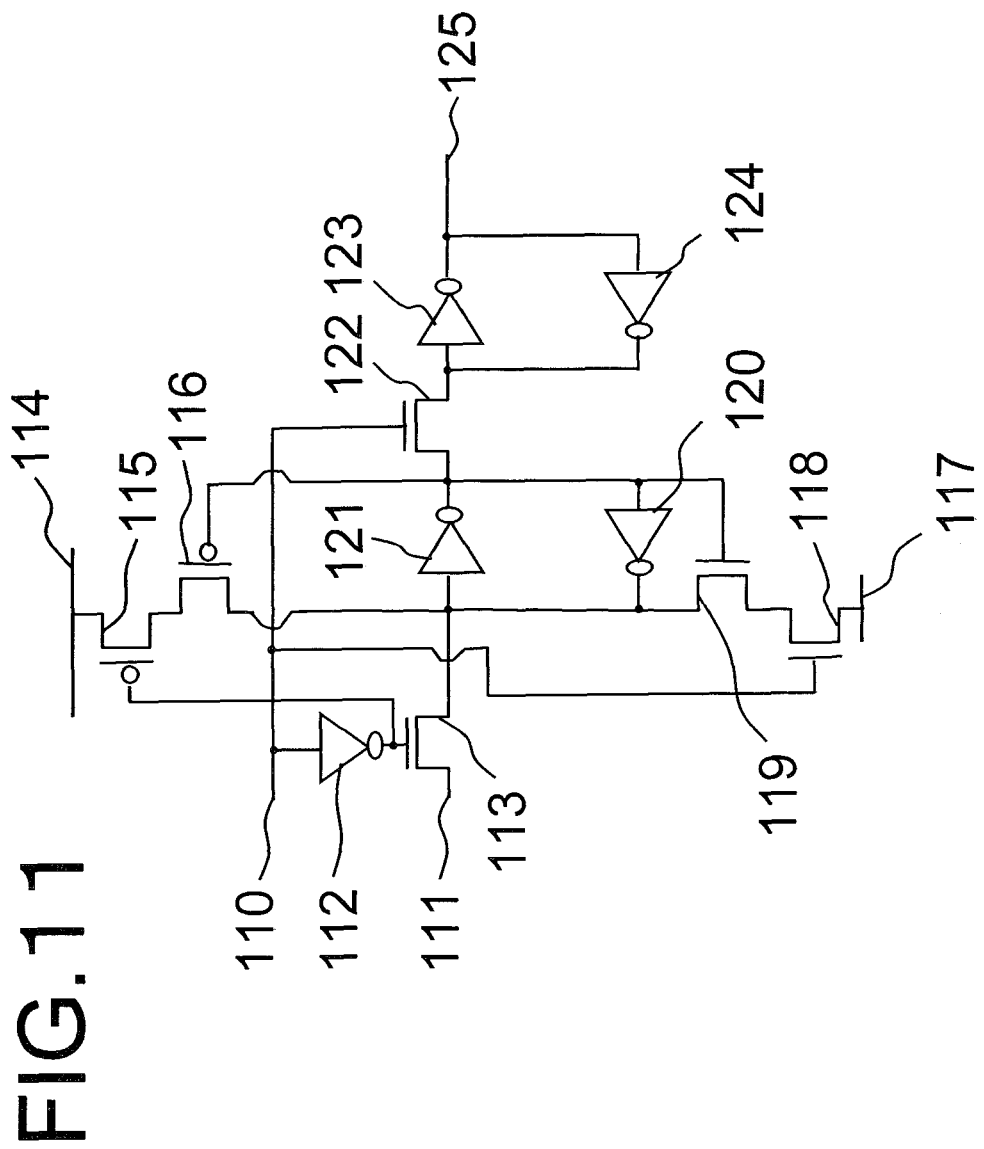
FIG. 11 shows a circuit that represents a flip-flop in a signal transmission circuit according to a third embodiment, the flip-flop including a master flip-flop in which the logic inversion rate of a held signal is low.

FIG. 11 shows a circuit that represents a flip-flop in a signal transmission circuit according to the third embodiment, the flip-flop including a master flip-flop in which the logic inversion rate of a held signal is low. FIG. 11 shows a clock signal 110, an input signal 111, an inverter 112, a transfer transistor 113, a power supply (Vcc) 114 having a high voltage, P-transistors 115 and 116, a power supply (Vss) 117 having a low voltage, N-transistors 118 and 119, inverters 120 and 121, a transfer gate transistor 122, inverters 123 and 124, and an output signal 125.

The inverters 120 and 121 constitute the master flip-flop. The inverters 123 and 124 constitute a slave flip-flop. The input signal 111 is received by the master flip-flop when the transfer gate 113 is turned on. A signal from the master flip-flop is transferred to the slave flip-flop when the transfer transistor 122 is turned on. The output of the inverter 123 is the output signal 125.

The P-transistor 115 and the N-transistor 118 are turned on only when the logic of the clock signal 110 is "H" and supply the power supplies (Vcc and Vss) to the P-transistor 116 and the N-transistor 119. The P-transistor 116 is turned on when the logic of a signal held in a critical node between the inverter 121 and the transfer transistor 122 is "L". The N-transistor 119 is turned on when the logic of a signal held in the critical node between the inverter 121 and the transfer transistor 122 is "H".

Thus, in a case where the logic of the clock signal 110 is "H", when the transfer transistor 113 is closed, the same potential as the logic of a signal held in a critical node between the transfer gate 113 and the inverter 112 is supplied by the P-transistors 115 and 116 or the N-transistors 118 and 119 from the power supplies (Vcc and Vss). In a case where the logic of the clock signal 110 is "L", when the transfer transistor 113 is open, the P-transistor 115 and the N-transistor 118 are turned off. When the input signal 111 is received, the P-transistors 115 and 116 and the N-transistors 118 and 119 do not supply potential. Thus, these transistors do not become a barrier to receiving the input signal 111. Accordingly, the delay of an output signal from the flip-flop having the structure in FIG. 11 is the same as that of a flip-flop to which the P-transistors 115 and 116 and the N-transistors 118 and 119 are not added.

That is to say, the flip-flop in the signal transmission circuit according to the third embodiment includes the master flip-flop, the slave flip-flop, the two P-transistors connected in series, which connect the critical node in the master flip-flop to the power supply, and the two N-transistors connected in series, which connect the critical node in the master flip-flop to the power supply. When the master flip-flop holds a signal, in response to the logic of the signal held in the critical node in the master flip-flop, the two P-transistors and the two N-transistors supply the same potential as the logic of the signal. Moreover, when the master flip-flop receives a signal, the two P-transistors and the two N-transistors stop supplying potential to the critical node.

In the signal transmission circuit according to the third embodiment, since the flip-flop in the signal transmission circuit operates as described above, even in a case where noise occurs due to, for example, alpha rays, when the logic of the clock signal is "H", the inversion probability of an output signal decreases. On the other hand, the delay in outputting a signal from the flip-flop in the signal transmission circuit is kept. Thus, an effect such that the total soft error rate of an LSI circuit decreases is achieved.

Fourth Embodiment

A fourth embodiment relates to a CAD device for implementing the method according to the first embodiment for designing a semiconductor device in which soft error tolerance is improved. The fourth embodiment will now be described using FIG. 12.

Figure 12:
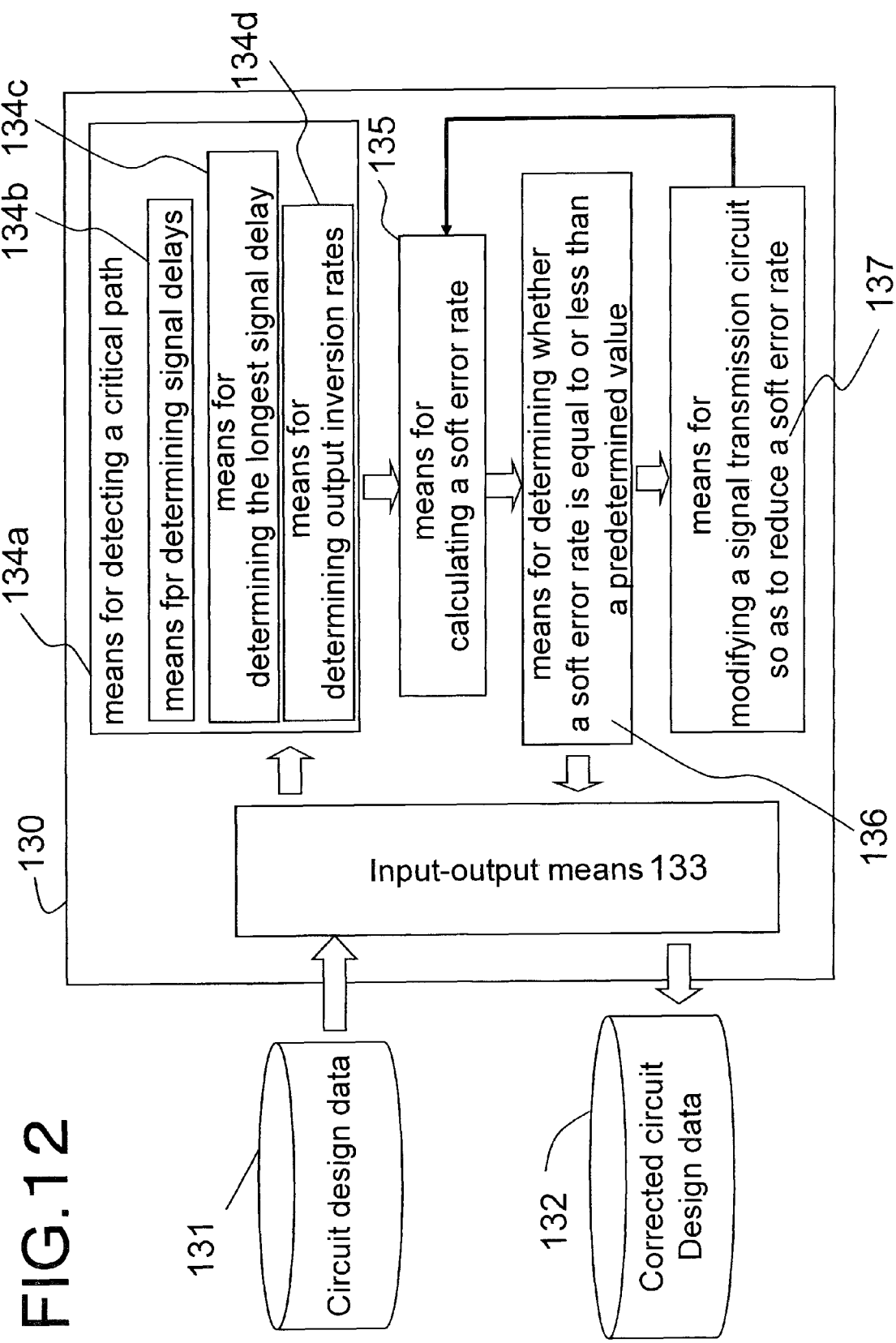
FIG. 12 shows the structure of a CAD device according to a fourth embodiment.

FIG. 12 shows the structure of the CAD device according to the fourth embodiment. FIG. 12 shows a CAD device 130, circuit design data 131, corrected circuit design data 133, input-output means 133, means 134a for detecting a critical path, means 134b for determining signal delays, means 134c for detecting the longest signal delay, means 134d for determining output inversion rates, means 135 for calculating a soft error rate, means 136 for determining whether a soft error rate is equal to or less than a predetermined value, and means 137 for modifying a signal transmission circuit so as to reduce a soft error rate.

The CAD device 130 retrieves the circuit design data 131 of an LSI circuit using the input-output means 132. Then, the CAD means 130 performs the process of detecting a critical path, described using FIGS. 2A, 2B, and 2C, using the means 134a for detecting a critical path, and performs the process of calculating a soft error rate, described using FIGS. 3A to 3C and 4A to 4B, using the means 135 for calculating a soft error rate. The CAD means 130 compares the aforementioned soft error rate with a predetermined soft error rate to determine whether the aforementioned soft error rate satisfies the predetermined soft error rate, using the means 136 for determining whether a soft error rate is equal to or less than a predetermined value. In the means 134a for detecting a critical path, signal delays are determined by the means 134b for determining signal delays, the longest signal delay is detected by the means 134c for detecting the longest signal delay, and output inversion rates are determined by the means 134d for determining output inversion rates. As the result, when the soft error rate of the LSI circuit does not satisfy the predetermined soft error rate, the design data of a signal transmission circuit is corrected so that the signal transmission circuit has the structure of the signal transmission circuit, in which the signal delay is extended, or the structure of the signal transmission circuit, in which the logic inversion rate of an output signal from a flip-flop in the signal transmission circuit is decreased, shown in, for example, FIGS. 5A to 5C, FIG. 7C, FIGS. 8A to 8D, FIGS. 9A to 9D, FIGS. 10A to 10B, or FIG. 11. Then, the CAD means 130 outputs the corrected circuit design data using the input-output means.

In the CAD device according to the fourth embodiment, since the CAD device operates as described above, the method according to the first embodiment for designing a semiconductor device in which soft error tolerance is improved can be implemented. Moreover, when an LSI circuit is manufactured on the basis of the corrected circuit design data output from the CAD device, an LSI circuit having a high soft error tolerance can be manufactured.

The invention claimed is:

1. A CAD device that implements a method for designing a semiconductor circuit device, the CAD device comprising:
    a first determining unit determining signal transmission time necessary for each signal transmission circuit in an LSI circuit to transmit a signal;
    a second determining unit determining a frequency distribution of the signal transmission time;
    a detecting unit detecting the longest signal transmission time on the basis of the signal transmission time;
    a third determining unit determining an output inversion rate at which the logic of an output signal from each flip-flop circuit is inverted on the basis of the amount of charge held in a critical node in each flip-flop circuit and a logic of input signal in each flip-flop;
    a calculating unit calculating a soft error rate of the LSI circuit on the basis of the frequency distribution of the signal transmission time, an operating clock period, and the output inversion rate of each flip-flop circuit; and
    a modifying unit, when a predetermined soft error rate is less than the soft error rate of the LSI circuit as a result of comparison, modifying the LSI circuit to the extent possible without changing the longest signal transmission time by changing the frequency distribution of the signal transmission time.

2. The CAD device according to claim 1, wherein the CAD device that modifies the LSI circuit reduces the soft error rate of the LSI circuit by modifying a delay element that constitutes each signal transmission circuit.

3. The CAD device according to claim 2, wherein each signal transmission circuit comprises:
   a first flip-flop circuit;
   a second flip-flop circuit; and
   the delay element, which is disposed between an output terminal of the first flip-flop circuit and an input terminal of the second flip-flop circuit, transmits a signal from the output terminal to the input terminal after delaying the signal, and includes a dummy circuit, and
   modifying the delay element, which constitutes each signal transmission circuit, means changing the dummy circuit to an inverter circuit.

4. The CAD device according to claim 2, wherein each signal transmission circuit comprises:
   a first flip-flop circuit;
   a second flip-flop circuit; and
   the delay element, which is disposed between an output terminal of the first flip-flop circuit and an input terminal of the second flip-flop circuit, transmits a signal from the output terminal to the input terminal after delaying the signal, and includes a capacitance, and
   modifying the delay element, which constitutes each signal transmission circuit, is performed by increasing or decreasing the capacitance.

5. The CAD device according to claim 2, wherein each signal transmission circuit comprises:
   a first flip-flop circuit;
   a second flip-flop circuit; and
   the delay element, which is disposed between an output terminal of the first flip-flop circuit and an input terminal of the second flip-flop circuit, transmits a signal from the output terminal to the input terminal after delaying the signal, and includes a resistance, and
   modifying the delay element, which constitutes each signal transmission circuit, is performed by increasing or decreasing the resistance.

6. The CAD device according to claim 1, wherein the CAD device that modifies the LSI circuit modifies each flip-flop circuit so as to reduce the output inversion rate of each flip-flop circuit.

7. The CAD device according to claim 6, wherein each signal transmission circuit comprises:
   a first flip-flop circuit that includes a master flip-flop and a slave flip-flop;
   a second flip-flop circuit; and
   a delay element that is disposed between an output terminal of the first flip-flop circuit and an input terminal of the second flip-flop circuit, and transmits a signal from the output terminal to the input terminal after delaying the signal, and
   modifying each flip-flop circuit means adding a capacitance to a critical node in the master flip-flop.

8. A method executed by a computer for designing a semiconductor circuit device aided by a CAD device, comprising:
   determining, using said computer, signal transmission time necessary for each signal transmission circuit in an LSI circuit to transmit a signal;
   determining a frequency distribution of the signal transmission time;
   detecting the longest signal transmission time on the basis of the signal transmission time;
   determining an output inversion rate at which the logic of an output signal from each flip-flop circuit is inverted on the basis of the amount of charge held in a critical node in each flip-flop circuit and a logic of input signal in each flip-flop;
   calculating a soft error rate of the LSI circuit on the basis of the frequency distribution of the signal transmission time, an operating clock period, and the output inversion rate of each flip-flop circuit; and
   modifying the LSI circuit to the extent possible without changing the longest signal transmission time when a predetermined soft error rate is less than the soft error rate of the LSI circuit as a result of comparison by changing the frequency distribution of the signal transmission time.

\* \* \* \* \*